(12) United States Patent
Li

(10) Patent No.: US 12,393,365 B2
(45) Date of Patent: Aug. 19, 2025

(54) METHOD OF CONTROLLING MEMORY, MEMORY AND MEMORY SYSTEM

(71) Applicant: YANGTZE MEMORY TECHNOLOGIES CO., LTD., Wuhan (CN)

(72) Inventor: Jianjie Li, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 67 days.

(21) Appl. No.: 18/238,181

(22) Filed: Aug. 25, 2023

(65) Prior Publication Data

US 2024/0078038 A1 Mar. 7, 2024

(51) Int. Cl.
*G11C 7/00* (2006.01)
*G06F 3/06* (2006.01)
*G11C 16/26* (2006.01)

(52) U.S. Cl.
CPC .......... *G06F 3/0656* (2013.01); *G06F 3/0608* (2013.01); *G06F 3/0679* (2013.01); *G11C 16/26* (2013.01)

(58) Field of Classification Search
CPC ....... G11C 7/1051; G11C 7/22; G11C 7/1072; G11C 7/1006; G11C 7/1066
USPC .......................... 365/189.15, 189.14, 189.05
See application file for complete search history.

(56) References Cited

U.S. PATENT DOCUMENTS

| 8,811,088 | B2 | 8/2014 | Joo et al. | |
|---|---|---|---|---|
| 2012/0221775 | A1 | 8/2012 | Kim et al. | |
| 2014/0071761 | A1 | 3/2014 | Sharon et al. | |
| 2014/0153331 | A1 | 6/2014 | Jang et al. | |
| 2016/0006458 | A1* | 1/2016 | Li .................. | H03M 13/1117 714/760 |
| 2019/0138392 | A1* | 5/2019 | Jung .................. | G11C 11/5642 |

FOREIGN PATENT DOCUMENTS

| CN | 109559777 A | 4/2019 |
|---|---|---|
| CN | 111863075 A | 10/2020 |

* cited by examiner

*Primary Examiner* — Son T Dinh
(74) *Attorney, Agent, or Firm* — BAYES PLLC

(57) ABSTRACT

According to one aspect of the present disclosure, a method of controlling a memory is provided. The method may include performing a read operation based on a read voltage corresponding to a target logical page to obtain a hard read value and a soft read value of the target logical page. The method may include storing the hard read value, the soft read value, and inhibition information into three latches in a page buffer respectively. The method may include obtaining hard data of the target logical page based on the hard read value of the target logical page. The method may include obtaining soft data of the target logical page based on the hard data and the soft read value of the target logical page. The memory may include a plurality of memory cells, each configured to store N-bit data, where N is an integer greater than 1.

20 Claims, 15 Drawing Sheets

| | DS | DL | D1 | D2 | DC |
|---|---|---|---|---|---|
| After performing read operation with $V_{R1}-\triangle V$ | | Inhibition info. $V_{R5}-\triangle V$ | | | data1 |
| After performing read operation with $V_{R1}+\triangle V$ | | Inhibition info. $V_{R5}-\triangle V$ | Inhibition info. $V_{R5}+\triangle V$ | | data2 |
| After performing read operation with $V_{R5}-\triangle V$ | Inhibition info. $V_{R5}-\triangle V$ | Inhibition info. corresponding to $V_{R5}-\triangle V$ | Inhibition info. $V_{R5}+\triangle V$ | data3 | data2 |
| After performing read operation with $V_{R5}+\triangle V$ | Inhibition info. $V_{R5}+\triangle V$ | Inhibition info. $V_{R5}-\triangle V$ | Inhibition info. $V_{R5}+\triangle V$ | | data4 |

Fig. 8b

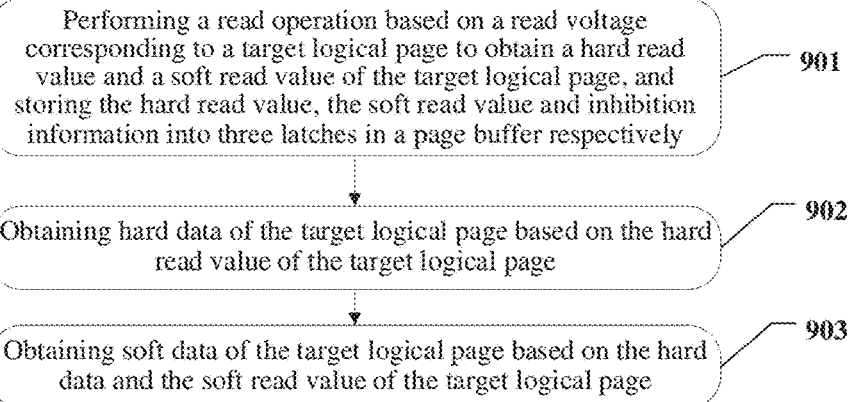

Fig. 9

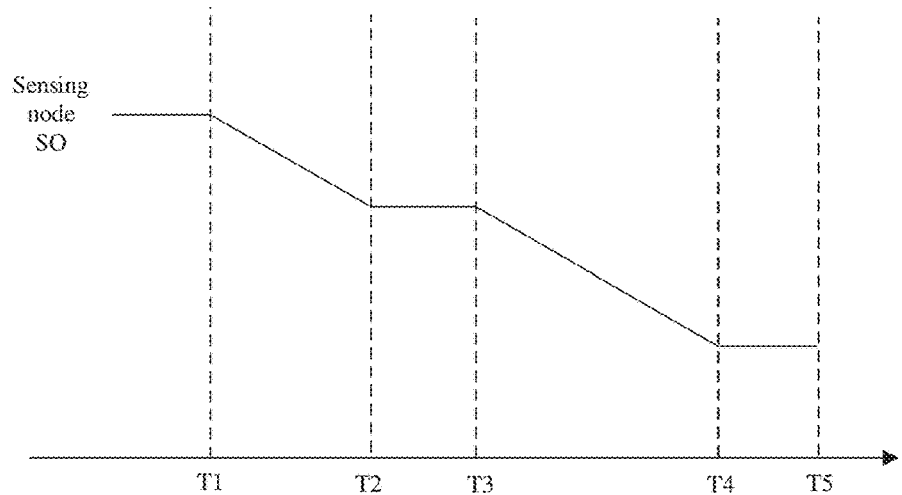

Fig. 10

|  | DS | DL | D1 | D2 | DC |
|---|---|---|---|---|---|
| After performing read operation with first hard read voltage | Inhibition information corresponding to first soft read voltage | First hard read value |  |  |  |
| After performing read operation with first soft read voltage | Inhibition information corresponding to second hard read voltage | First hard read value | First soft read value |  |  |
| After performing read operation with second hard read voltage | Inhibition information corresponding to second soft read voltage | Hard data | First soft read value |  |  |
| After performing read operation with second soft read voltage | Inhibition information corresponding to second soft read voltage | Hard data | Soft calculation value |  |  |
| XOR operation | Soft data | Hard data | Soft calculation value |  |  |
| Dump |  |  |  | Hard data | Soft data |

Fig. 12b

|  | DS | DL | D1 | D2 | D3 | DC |
|---|---|---|---|---|---|---|
| After read operation with $V_{R2}'$ | Inhibition info. $V_{R2}'+\Delta V$ | Hard read value $V_{R2}'$ |  |  |  |  |
| After read operation with $V_{R2}'+\Delta V$ | Inhibition info. $V_{R8}'$ | Hard read value $V_{R2}'$ | Soft read value $V_{R2}'$ |  |  |  |
| After read oper. with $V_{R8}'$ | Inhibition info. $V_{R8}'+\Delta V$ | Data1' | Soft read value $V_{R2}'$ |  |  |  |
| After read oper. with $V_{R8}'+\Delta V$ | Inhibition info. $V_{R14}'$ | Data1' | Data2' |  |  |  |
| After p read oper. with $V_{R14}'$ | Inhibition info. $V_{R14}'+\Delta V$ | Hard data | Data2' |  |  |  |
| After read oper. with $V_{R14}'+\Delta V$ | Inhibition info. $V_{R14}'+\Delta V$ | Hard data | Soft calc. value |  |  |  |
| XOR oper. | Soft data | Hard data | Soft calc. value |  |  |  |
| Dump |  |  |  |  | Hard data | Soft data |

Fig. 13b

| | DS | DL | D1 | D2 | DC |
|---|---|---|---|---|---|
| After first read operation | First inhibition information | First hard read value | First soft read value | | |
| After second read operation | First inhibition information | Hard data | Soft calc. value | | |
| XOR operation | Soft data | Hard data | Soft calc. value | | |
| Dump | | | | Hard data | Soft data |

US 12,393,365 B2

METHOD OF CONTROLLING MEMORY, MEMORY AND MEMORY SYSTEM

CROSS-REFERENCE TO RELATED APPLICATIONS

The present application claims the benefit of priority to China Application No. 202211065222.2, filed on Sep. 1, 2022, the content of which is incorporated herein by reference in its entirety.

TECHNICAL FIELD

The present disclosure relates to the technical field of semiconductor technology, and in particular, to a method of controlling a memory, a memory, and a memory system.

BACKGROUND

With the continuous development of semiconductor technology, the current memory manufacturing technologies have gradually transitioned from a simple planar structure into a more complex three-dimensional structure, and the integration density is increased by three-dimensionally arranging memory cells on a substrate. This technical research and development of the three-dimensional memory device is one of the mainstreams of world-wide research and development.

SUMMARY

According to one aspect of the present disclosure, a method of controlling a memory is provided. The method may include performing a read operation based on a read voltage corresponding to a target logical page to obtain a hard read value and a soft read value of the target logical page. The method may include storing the hard read value, the soft read value, and inhibition information into three latches in a page buffer respectively. The method may include obtaining hard data of the target logical page based on the hard read value of the target logical page. The method may include obtaining soft data of the target logical page based on the hard data and the soft read value of the target logical page. The memory may include a plurality of memory cells. Each of the memory cells may be configured to store N-bit data, where N is an integer greater than 1.

In some implementations, the page buffer may include a master latch, a bias latch, and N data latches. In some implementations, the storing the hard read value, the soft read value, and the inhibition information into the three latches in the page buffer respectively may include storing the hard read value, the soft read value, and the inhibition information into the bias latch, a first data latch of the N data latches, and the master latch respectively. In some implementations, the storing the hard read value, the soft read value, and the inhibition information into the three latches in the page buffer respectively may include storing the hard read value, the soft read value, and the inhibition information into the first data latch of the N data latches, the bias latch, and the master latch respectively.

In some implementations, after obtaining the hard data, the method may include releasing the master latch. In some implementations, after obtaining the soft data, storing the soft data into the master latch.

In some implementations, the method may include dumping the hard data from the bias latch or the first data latch into a second data latch of the N data latches. In some implementations, the method may include dumping the soft data from the master latch into a third data latch of the N data latches. In some implementations, the method may include releasing the bias latch, the first data latch, and the master latch.

In some implementations, each of the target logical pages corresponds to at least one of the read voltages. In some implementations, the performing the read operation based on the read voltage corresponding to the target logical page to obtain the hard read value and the soft read value of the target logical page, after applying each of the read voltages to the memory cell, obtaining the hard read value and the soft read value corresponding to the read voltage respectively by a first sensing and a second sensing that are continuous, the method may include sensing time of the first sensing being less than sensing time of the second sensing.

In some implementations, when N is 3, each of the memory cells is configured to store 3-bit data in one of $2^3$ memory states. In some implementations, a first read voltage to a seventh read voltage are used to distinguish the $2^3$ memory states.

In some implementations, when N is 3, a first logical page of three logical pages corresponds to the first read voltage and a fifth read voltage. In some implementations, a second logical page of the three logical pages corresponds to a second read voltage, a fourth read voltage, and a sixth read voltage. In some implementations, a third logical page of the three logical pages corresponds to a third read voltage and the seventh read voltage. In some implementations, the first read voltage to the seventh read voltage increase sequentially.

In some implementations, when the target logical page is the first logical page, the performing the read operation based on the read voltage corresponding to the target logical page to obtain the hard read value and the soft read value of the target logical page the method may include applying the first read voltage to the memory cell. In some implementations, when the target logical page is the first logical page, the performing the read operation based on the read voltage corresponding to the target logical page to obtain the hard read value and the soft read value of the target logical page the method may include obtaining a first hard read value and a first soft read value respectively by a first sensing and a second sensing that are continuous, where a first sensing time of the first sensing is less than a second sensing time of the second sensing. In some implementations, when the target logical page is the first logical page, the performing the read operation based on the read voltage corresponding to the target logical page to obtain the hard read value and the soft read value of the target logical page the method may include applying the fifth read voltage to the memory cell. In some implementations, when the target logical page is the first logical page, the performing the read operation based on the read voltage corresponding to the target logical page to obtain the hard read value and the soft read value of the target logical page the method may include obtaining a second hard read value and a second soft read value respectively by a third sensing and a fourth sensing that are continuous, where a third sensing time of the third sensing is less than a fourth sensing time of the fourth sensing, the first hard read value and the second hard read value constituting the hard read value of the first logical page, and the first soft read value and the second soft read value constituting the soft read value of the first logical page.

In some implementations, the performing the read operation based on the read voltage corresponding to the target logical page to obtain the hard read value and the soft read value of the target logical page may include applying a hard read voltage and a soft read voltage to the memory cells respectively to obtain the hard read value and the soft read value of the target logical page respectively.

According to another aspect of the present disclosure, a memory is provided. The memory may include a memory cell array with a plurality of memory cells. Each of the memory cells may be configured to store N-bit data, where N is an integer greater than 1. In some implementations, the memory may include a peripheral circuit coupled to the memory cell array and including a page buffer. In some implementations, the peripheral circuit is configured to perform a read operation based on a read voltage corresponding to a target logical page to obtain a hard read value and a soft read value of the target logical page, and store the hard read value, the soft read value, and inhibition information into three latches in the page buffer respectively. In some implementations, the peripheral circuit is configured to obtain hard data of the target logical page based on the hard read value of the target logical page. In some implementations, the peripheral circuit is configured to obtain soft data of the target logical page based on the hard data and the soft read value of the target logical page.

In some implementations, the page buffer may include a master latch, a bias latch, and N data latches. In some implementations, the peripheral circuit may be configured to store the hard read value, the soft read value, and the inhibition information into the bias latch, a first data latch of the N data latches, and the master latch respectively. In some implementations, the peripheral circuit may be configured to store the hard read value, the soft read value, and the inhibition information into the first data latch of the N data latches, the bias latch, and the master latch respectively.

In some implementations, the peripheral circuit may be configured to after obtaining the hard data, release the master latch. In some implementations, the peripheral circuit may be configured to after obtaining the soft data, store the soft data into the master latch.

In some implementations, the peripheral circuit may be configured to dump the hard data from the bias latch or the first data latch into a second data latch of the N data latches. In some implementations, the peripheral circuit may be configured to dump the soft data from the master latch into a third data latch of the N data latches. In some implementations, the peripheral circuit may be configured to release the bias latch, the first data latch, and the master latch.

In some implementations, each of the target logical pages corresponds to at least one of the read voltages. In some implementations, the peripheral circuit may be configured to, after applying each of the read voltages to the memory cell, obtain the hard read value and the soft read value corresponding to the read voltage respectively by a first sensing and a second sensing that are continuous, a first sensing time of the first sensing being less than a second sensing time of the second sensing.

In some implementations, when N is 3, each of the memory cells may be configured to store 3-bit data in one of $2^3$ memory states. In some implementations, a first read voltage to a seventh read voltage may be used to distinguish the $2^3$ memory states.

In some implementations, when N is 3, a first logical page of three logical pages may correspond to the first read voltage and a fifth read voltage. In some implementations, a second logical page of the three logical pages may correspond to a second read voltage, a fourth read voltage, and a sixth read voltage. In some implementations, a third logical page of the three logical pages may correspond to a third read voltage and the seventh read voltage. In some implementations, the first read voltage to the seventh read voltage may increase sequentially.

In some implementations, when the target logical page is the first logical page, the peripheral circuit may be configured to apply the first read voltage to the memory cell. In some implementations, when the target logical page is the first logical page, the peripheral circuit may be configured to obtain a first hard read value and a first soft read value respectively by a first sensing and a second sensing that are continuous. In some implementations, a first sensing time of the first sensing may be less than a second sensing time of the second sensing. In some implementations, when the target logical page is the first logical page, the peripheral circuit may be configured to apply the fifth read voltage to the memory cell. In some implementations, when the target logical page is the first logical page, the peripheral circuit may be configured to obtain a second hard read value and a second soft read value respectively by a third sensing and a fourth sensing that are continuous. In some implementations, a third sensing time of the third sensing may be less than a third sensing time of the fourth sensing. In some implementations, the first hard read value and the second hard read value may constitute the hard read value of the first logical page, and the first soft read value and the second soft read value may constitute the soft read value of the first logical page.

In some implementations, the peripheral circuit may be configured to apply a hard read voltage and a soft read voltage to the memory cells respectively to obtain the hard read value and the soft read value of the target logical page respectively.

According to a further aspect of the present disclosure, a memory system is provided. The memory system may include at least one memory. The at least one memory may include a memory cell array may include a plurality of memory cells. Each of the memory cells may be configured to store N-bit data, where N is an integer greater than 1. The memory may include a peripheral circuit coupled to the memory cell array. The peripheral circuit may include a page buffer. The peripheral circuit may be configured to perform a read operation based on a read voltage corresponding to a target logical page to obtain a hard read value and a soft read value of the target logical page, and store the hard read value, the soft read value, and inhibition information into three latches in the page buffer respectively. The peripheral circuit may be configured to obtain hard data of the target logical page based on the hard read value of the target logical page. The peripheral circuit may be configured to obtain soft data of the target logical page based on the hard data and the soft read value of the target logical page. The memory system may include a controller coupled to the memory.

In some implementations, the page buffer may include a master latch, a bias latch, and N data latches. In some implementations, the peripheral circuit may be configured to store the hard read value, the soft read value, and the inhibition information into the bias latch, a first data latch of the N data latches, and the master latch respectively. In some implementations, the peripheral circuit may be configured to store the hard read value, the soft read value, and the inhibition information into the first data latch of the N data latches, the bias latch, and the master latch respectively.

BRIEF DESCRIPTION OF THE DRAWINGS

FIG. 8b is a schematic diagram of use status of latches in a page buffer during the storage process of soft data reading, according to an example of the present disclosure.

FIG. 9 is a schematic flowchart of a method of controlling a memory, according to an example of the present disclosure.

FIG. 10 is a schematic diagram of continuous sensing, according to an example of the present disclosure.

FIG. 12b is a schematic diagram of use status of the latches in the page buffer during the storage process of reading data of lower page of TLC, according to an example of the present disclosure.

FIG. 13b is a schematic diagram of use status of the latches in the page buffer during the storage process of reading data of lower page of QLC, according to an example of the present disclosure.

DETAILED DESCRIPTION

Figure 1:
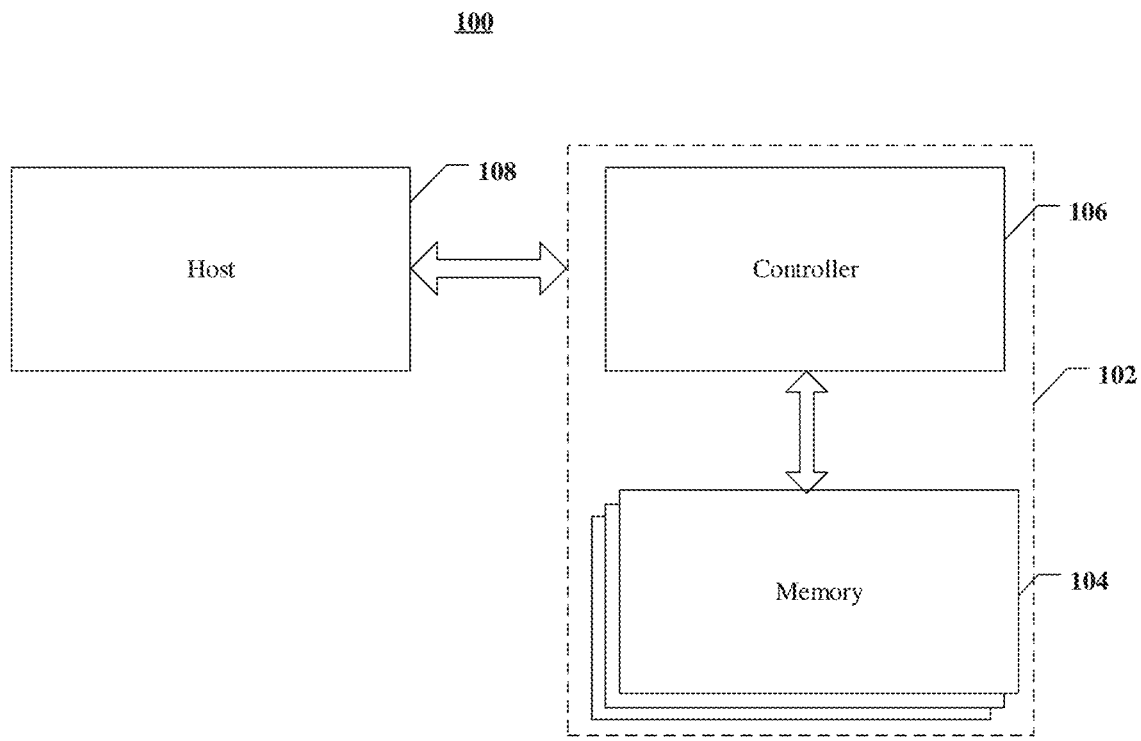
FIG. 1 is a block diagram of a memory system, according to an example of the present disclosure.

Examples of the present disclosure will be described in more detail below with reference to the accompanying drawings. Although examples of the present disclosure are shown in the drawings, it should be understood that the present disclosure may be implemented in various ways and should not be limited to the DETAILED DESCRIPTION set forth herein. Rather, these examples are provided so that the present disclosure can be more thoroughly understood and the scope of the present disclosure can be fully conveyed to those skilled in the art.

In the following description, numerous specific details are given in order to provide a more thorough understanding of the present disclosure. It will be apparent, however, to one skilled in the art that the present disclosure may be practiced without one or more of these details. In other examples, some technical features well-known in the art are not described to avoid confusion with the present disclosure; that is, not all features of the actual example are described here, and well-known functions and structures are not described in detail.

In the drawings, the size of layers, regions, elements and their relative sizes may be exaggerated for clarity. Like reference numerals refer to like elements throughout.

It should be understood that spatial relationship terms such as "under", "below", "beneath", "underneath", "on", "above" and so on, can be used here for convenience to describe the relationship between one element or feature and other elements or features shown in the figures. It will be understood that the spatial relationship terms also comprise different orientations of the device in use and operation in addition to the orientation depicted in the figures. For example, if the device in the figures is turned over, elements or features described as "below" or "underneath" or "under" other elements or features would then be oriented as "above" the other elements or features. Thus, the example terms "below" and "under" can comprise both orientations of above and below. The device may be otherwise oriented (rotated 90 degrees or at other orientations) and the spatial descriptors used herein may be interpreted accordingly.

The terminology used herein is for the purpose of describing particular examples only and is not to be taken as a limitation of the present disclosure. As used herein, "a", "an" and "said/the" in singular forms are intended to include the plural forms as well, unless the context clearly dictates otherwise. It should also be understood that at least one of the terms "consists of" or "comprising", when used in this specification, identify the presence of at least one of stated features, integers, operations, elements or components, but do not exclude presence or addition of at least one of one or more other features, integers, operations, elements, components or groups. As used herein, the term "at least one of . . . " includes any and all combinations of the associated listed items.

Referring to FIG. 1, a block diagram of a memory system according to an example of the present disclosure is shown. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having a memory therein. As shown in FIG. 1, system 100 can include a host 108 and a memory system 102 having one or more memory 104 and a controller 106. Host 108 can be a processor of an electronic device, such as a central processing unit (CPU), or a system-on-chip (SoC), such as an application processor (AP). Host 108 can be configured to send or receive data to or from the memory 104.

Memory 104 may be any memory disclosed in this disclosure. As disclosed in detail below, memory 104 (e.g., a NAND flash memory (e.g., three-dimensional (3D) NAND flash memory)) may have a reduced leakage current from a driver transistor (e.g., a string driver) coupled to an unselected word line during an erase operation, which allows further size reduction of the driver transistor.

Controller 106 is coupled to the memory 104 and host 108 and is configured to control the memory 104, according to some examples. Controller 106 can manage the data stored in memory 104 and communicate with host 108. In some examples, controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some examples, controller 106 is designed for operating in a high duty-cycle environment SSD or embedded multi-media-cards (eMMCs) used as data storage for mobile devices, such as smartphones, tablets, laptop computers, etc., and enterprise storage arrays. Controller 106 can be configured to control operations of the memory 104, such as read, erase, and program operations. Controller 106 can also be configured to manage various functions with respect to the data stored or to be stored in the memory 104 including, but not limited to bad-block management, garbage collection, logical-to-physical address conversion, wear leveling, etc. In some examples, controller 106 is further configured to process error correction codes (ECCs) with respect to the data read from or written to the memory 104. Any other suitable functions may be performed by controller 106 as well, for example, formatting the memory 104. Controller 106 can communicate with an external device (e.g., host 108) according to a particular communication protocol. For example, controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
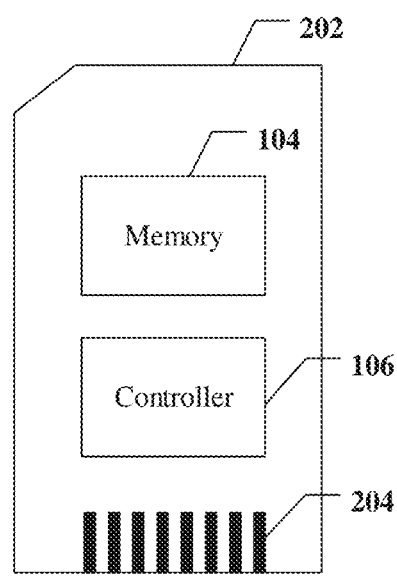
FIG. 2a is a schematic diagram of a memory card, according to an example of the present disclosure.
Figure 2B:
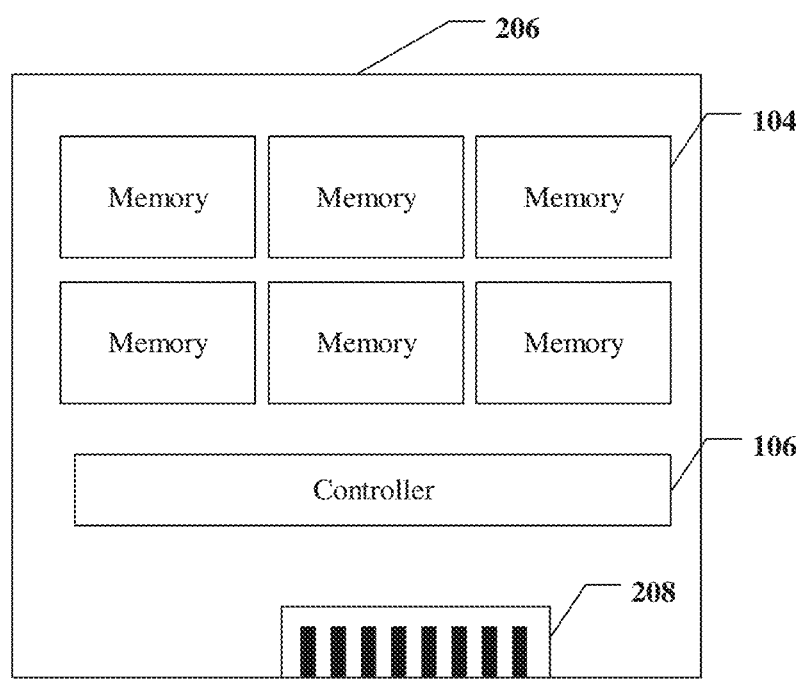
FIG. 2b is a schematic diagram of a solid-state drive (SSD), according to an example of the present disclosure.

Controller 106 and memory 104 (e.g., one or more memories) can be integrated into various types of storage devices. For instance, controller 106 and memory 104 can be included in the same package, e.g., such as a universal Flash storage (UFS) package or an eMMC package. That is, memory system 102 can be implemented and packaged into different types of end electronic products. In one example as shown in FIG. 2a, controller 106 and a memory 104 (e.g., a single memory) may be integrated into a memory card 202. Memory card 202 can include a personal computer (PC) card (e.g., personal computer memory card international association (PCMCIA)), Multimedia Cards (MMC), Embedded MMC (eMNIC), Reduced Size MMC (RS-MMC), Micro MMC, Secure Digital (SD) cards, Mini SD, Micro SD, Universal Serial Bus (USB) memory devices, Universal Flash Memory (UFS) devices, Compact Flash (CF) cards, Smart Media (SM) cards. Memory card 202 can further include a memory card connector 204 coupling memory card 202 with a host (e.g., host 108 in FIG. 1). In another example as shown in FIG. 2b, controller 106 and multiple memory 104 may be integrated into an SSD 206. SSD 206 can further include an SSD connector 208 coupling SSD 206 with a host (e.g., host 108 in FIG. 1). In some examples, at least one of the storage capacity or the operation speed of SSD 206 is greater than those of memory card 202.

Figure 3:
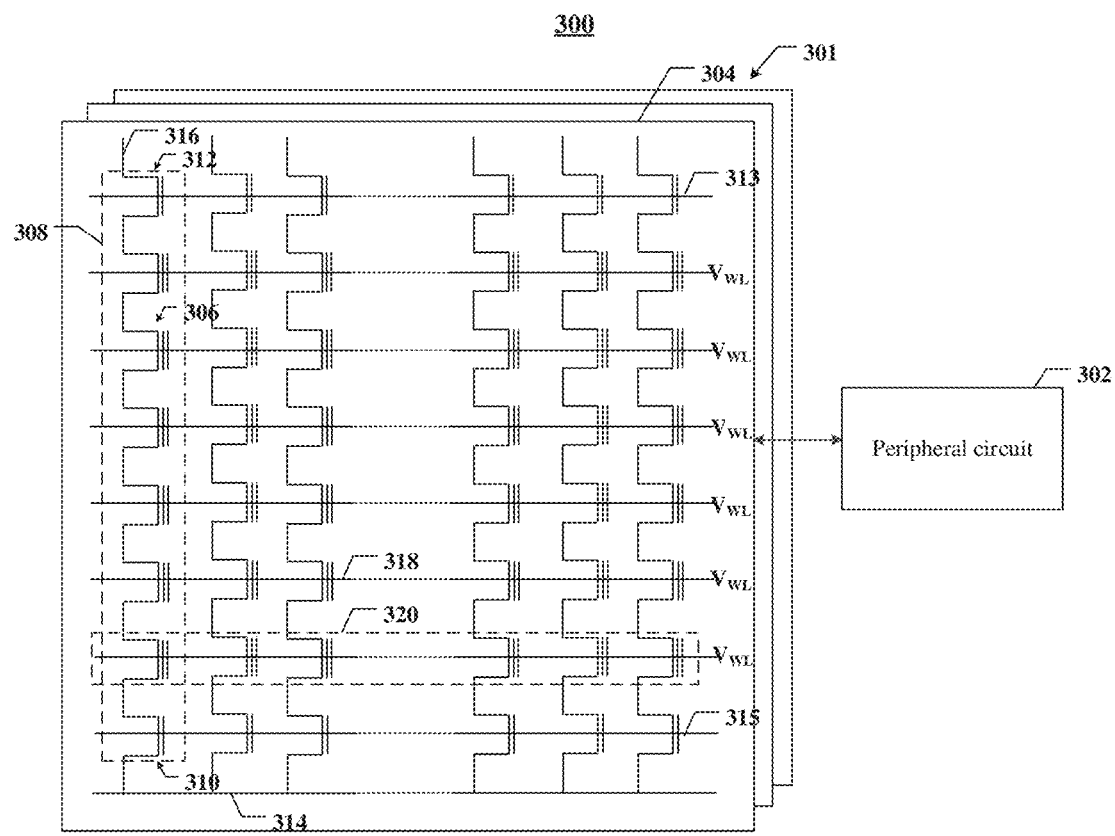
FIG. 3 is a schematic diagram of an example memory including peripheral circuits, according to an example of the present disclosure.

FIG. 3 is a schematic circuit diagram of an example memory 300 including peripheral circuits in accordance with aspects of the present disclosure. Memory 300 may be an example of memory 104 in FIG. 1. The memory 300 may include a memory cell array 301 and a peripheral circuit 302 coupled to the memory cell array 301. The memory cell array 301 may be a NAND flash memory cell array in which memory cells 306 are provided in the form of an array of NAND memory strings 308 each extending vertically above a substrate (not shown). In some examples, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge trap transistor.

Each of the memory cells 306 has any one of a plurality of memory states. In some examples, each memory cell 306 can be configured to store N-bit data in one of $2^N$ memory states, where N is an integer greater than 1. The $2^N$ memory states include an erased state and $2^N-1$ non-erased states. In some examples, each memory cell 306 is a single-level cell (SLC) that has two possible memory states, and thus, can store one bit of data. For example, the first memory state "0" may correspond to a first range of voltages, and the second memory state "1" may correspond to a second range of voltages. In some examples, each memory cell 306 is a xLC that is capable of storing more than a single bit of data in more than four memory states (levels). For example, a program operation is performed by writing one of three possible nominal storage values to the MLC memory cell, to program the MLC memory cell from an erased state to one of three possible programming levels (e.g., 01, 10 and 11). A fourth nominal storage value may be used to represent an erased state (e.g., 00).

As shown in FIG. 3, each NAND memory string 308 can further include a source selective gate (SSG) transistor 310 at its source end and a drain selective gate (DSG) transistor 312 at its drain end. SSG transistor 310 and DSG transistor 312 can be configured to activate selected NAND memory strings 308 (columns of the array) during read and program operations. In some examples, the sources of NAND memory strings 308 in a same block 304 are coupled through a same source line (SL) 314, e.g., a common SL. In other words, according to some examples, all NAND memory strings 308 in the same block 304 have an array common source (ACS). According to some examples, the drain of each NAND memory string 308 is coupled to a respective bit line 316 from which data can be read or written via an output bus (not shown). In some examples, each NAND memory string 308 is configured to be selected or deselected by at least one of applying a select voltage or a deselect voltage to the gate of respective DSG transistor 312 through one or more DSG lines 313 or applying a select voltage or a deselect voltage to the gate of respective SSG transistor 310 through one or more SSG lines 315.

As shown in FIG. 3, NAND memory strings 308 can be organized into multiple memory blocks 304, each of which can have a common source line 314, e.g., coupled to the ACS. In some examples, each memory block 304 is the basic data unit for erase operations, e.g., all memory cells 306 on the same memory block 304 are erased at the same time. To erase memory cells 306 in a selected memory block 304, source lines 314 coupled to selected memory block 304 as well as unselected memory blocks 304 in the same plane as selected memory block 304 can be biased with an erase voltage (Vers), such as a high positive voltage (e.g., 20 V or more). Memory cells 306 of adjacent NAND memory strings 308 can be coupled through word lines 318 that select which row of memory cells 306 is affected by read and program operations. In some examples, each word line 318 is coupled to a memory page 320 of memory cells 306, and the memory page 320 is the basic data unit for read and program operations. The size of one memory page 320 in bits can relate to the number of NAND memory strings 308 coupled by word line 318 in one memory block 304. Each word line 318 can include a plurality of control gates (gate electrodes) at each memory cell 306 in respective memory page 320 and a gate line coupling the control gates.

As shown in FIG. 3, a memory cell array 301 may include an array of memory cells 306 in multiple rows and columns in each memory block 304. According to some examples, a row of memory cells 306 corresponds to one or more memory pages 320, and a column of memory cells corresponds to a NAND memory string 308. Multiple rows of memory cells 306 may be respectively coupled to word lines 318 and multiple columns of memory cells 306 may be respectively coupled to bit lines 316. Peripheral circuit 302 may be coupled to the memory cell array 301 via bit lines 316 and word lines 318.

Figure 4:
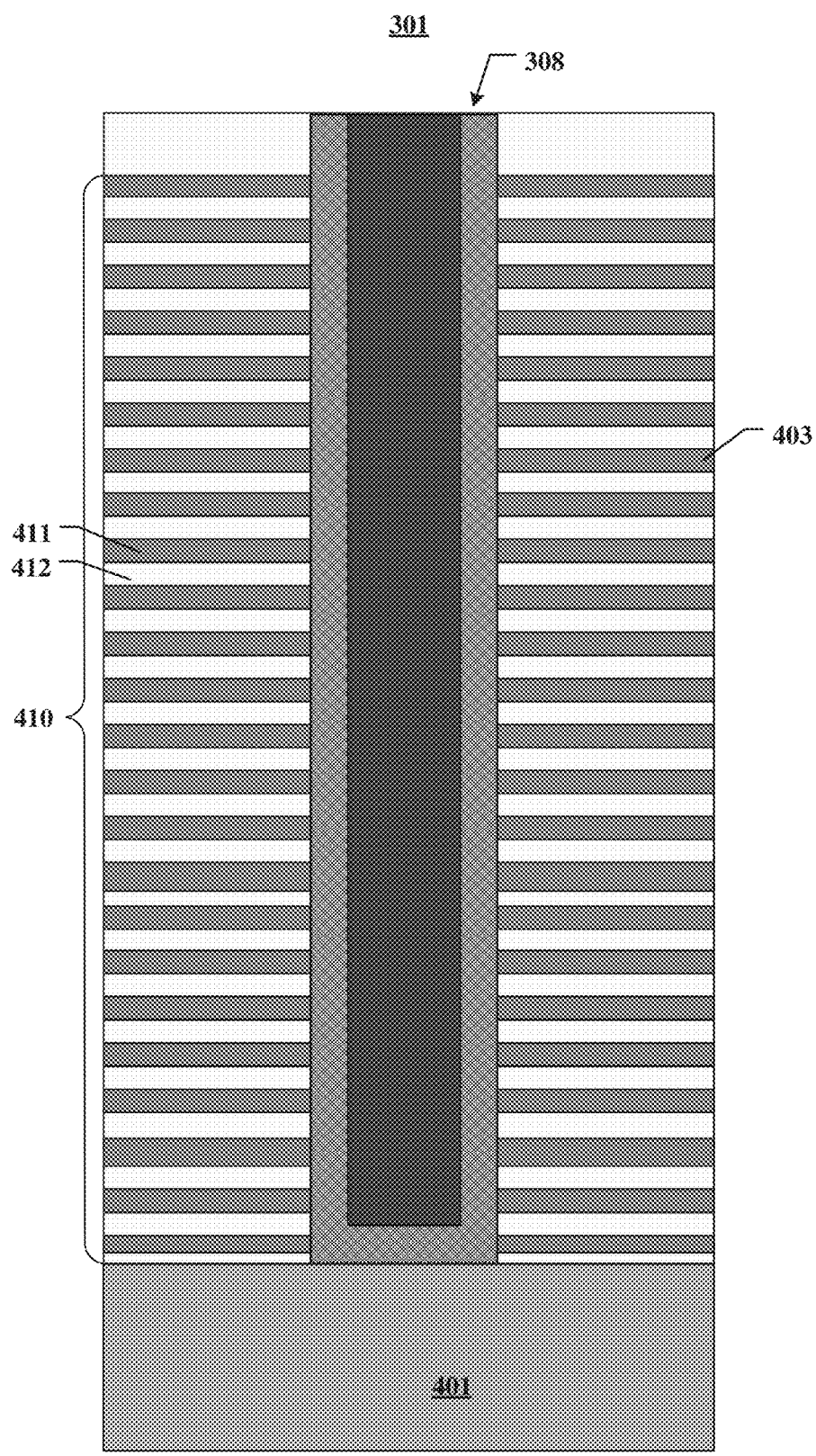
FIG. 4 is a schematic diagram of a cross-section of an example memory cell array including memory strings, according to an example of the present disclosure.

FIG. 4 illustrates a schematic cross-sectional view of an example memory array 301 including NAND memory strings 308 in accordance with aspects of the present disclosure. As shown in FIG. 4, the NAND memory string 308 may include a stacked structure 410, which includes a plurality of gate layers 411 and a plurality of insulating layers 412 alternately stacked in sequence, and memory string 308 vertically penetrating through the gate layers 411 and the insulating layers 412. The gate layer 411 and the insulating layer 412 can be stacked alternately, and two adjacent gate layers 411 are separated by an insulating layer 412. The number of pairs of gate layers 411 and insulating layers 412 in the stacked structure 410 can determine the number of memory cells included in the memory array 301.

The constituent material of the gate layer 411 may include a conductive material. The conductive material may include, but is not limited to, e.g., tungsten (W), cobalt (Co), Copper (Cu), aluminum (Al), polysilicon, doped silicon, silicide, or any combination thereof. In some examples, each gate layer 411 includes a metal layer, e.g., a tungsten layer. In some examples, each gate layer 411 includes a doped polysilicon layer. Each gate layer 411 may include a control gate surrounding the memory cell. The gate layer 411 at the top of the stacked structure 410 may extend laterally as a top selective gate line, the gate layer 411 at the bottom of the stacked structure 410 may extend laterally as a bottom selective gate line, and the gate layer 411 extending laterally between the top selective gate line and the bottom selective gate line may be used as a word line layer.

In some examples, the stacked structure 410 may be disposed on a substrate 401. The substrate 401 may include silicon (e.g., monocrystalline silicon), silicon germanium (SiGe), gallium arsenide (GaAs), germanium (Ge), silicon-on-insulator (SOI), germanium-on-insulator (GOI), or any other suitable material.

Figure 5:
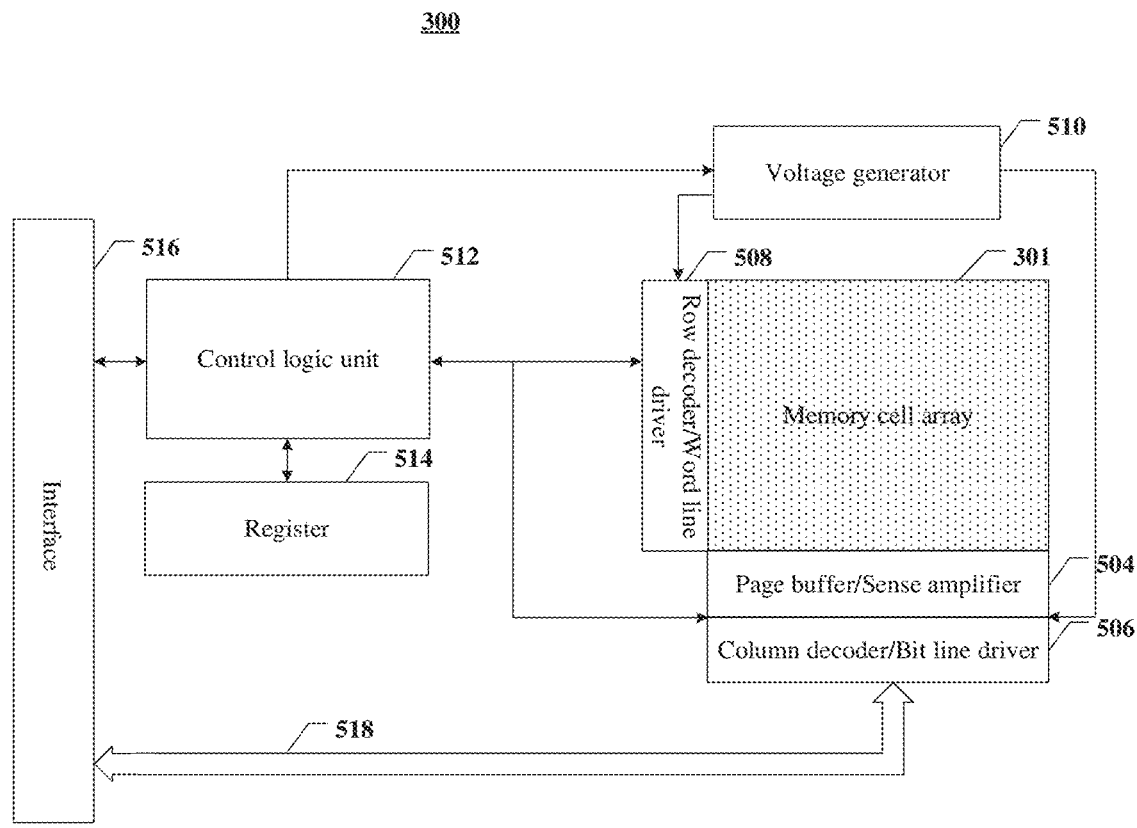
FIG. 5 is a block diagram of an example memory including a memory cell array and peripheral circuits, according to an example of the present disclosure.

Referring back to FIG. 3, peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing at least one of voltage signals or current signals to and from each target memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies. For example, FIG. 5 illustrates some example peripheral circuits 302. The peripheral circuits 302 may include, e.g., a page buffer/sense amplifier 504, a column decoder/bit line driver 506, a row decoder/word line driver 508, a voltage generator 510, control logic unit 512, registers 514, an interface 516, and a data bus 518. It is understood that in some examples, additional peripheral circuits not shown in FIG. 5 may be included as well.

Page buffer/sense amplifier 504 can be configured to read and program (write) data from and to memory cell array 301 according to the control signals from control logic unit 512. In one example, page buffer/sense amplifier 504 may store a page of program data (write data) to be programmed into a memory page 320 of the memory cell array 301. In another example, page buffer/sense amplifier 504 may perform program verify operations to ensure that the data has been properly programmed into memory cells 306 coupled to selected word lines 318. In still another example, page buffer/sense amplifier 504 may also sense the low power signals from bit line 316 that represents a data bit stored in memory cell 306 and amplify the small voltage swing to recognizable logic levels in a read operation. Column decoder/bit line driver 506 can be configured to be controlled by control logic unit 512 and select one or more NAND memory strings 308 by applying bit line voltages generated from voltage generator 510.

Row decoder/word line driver 508 can be configured to be controlled by control logic unit 512 and select/deselect memory blocks 304 of memory cell array 301 and select/deselect word lines 318 of memory block 304. Row decoder/word line driver 508 can be further configured to drive word lines 318 using word line voltages generated from voltage generator 510. In some examples, row decoder/word line driver 508 can also select/deselect and drive SSG lines 315 and DSG lines 313 as well. As described below in detail, row decoder/word line driver 508 is configured to perform erase operations on the memory cells 306 coupled to the selected word line(s) 318. Voltage generator 510 can be configured to be controlled by control logic unit 512 and generate the word line voltages (e.g., read voltage, program voltage, pass voltage, local voltage, verification voltage, etc.), bit line voltages, and source line voltages to be supplied to memory cell array 301.

Control logic unit 512 may be coupled to each peripheral circuit described above and configured to control the operation of each peripheral circuit. Registers 514 can be coupled to control logic unit 512 and include status registers, command registers, and address registers for storing status information, command operation codes (OP codes), and command addresses for controlling the operations of each peripheral circuit. Interface 516 may be coupled to control logic unit 512 and act as a control buffer to buffer and relay control commands received from a host (not shown) to control logic unit 512, and to buffer and relay status information received from control logic unit 512 to the host. Interface 516 may further be coupled to column decoder/bit line driver 506 via data bus 518 and act as a data I/O interface and data buffer to buffer and relay data to or from memory cell array 301.

In the process of reading the memory cells, due to the different memory states of the memory cells (e.g., the memory cell stores "1" or "0"), the channel current generated is also different. Based on this, the memory state of the memory cell can be obtained by sensing the channel current, so as to obtain the data stored in the memory cell. Considering that the channel current of the three-dimensional NAND memory is relatively small, it is difficult to directly measure the small current. In practical applications, in a case of a page buffer with a small area, the channel current may be indirectly measured by detecting the discharge of the sensing node SO in the page buffer, so as to obtain the memory state of the memory cell.

Figure 6:
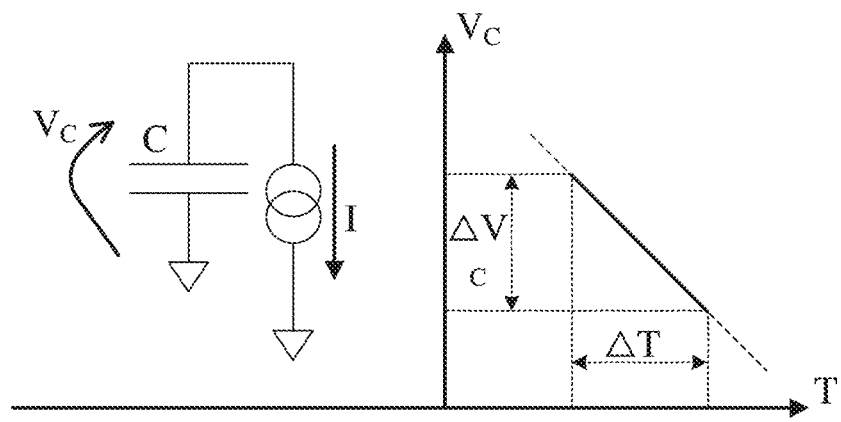
FIG. 6 is a schematic diagram of a discharge curve of a sensing node SO, according to an example of the present disclosure.

FIG. 6 is a schematic diagram of a discharge curve of a sensing node SO, according to an example of the present disclosure. As shown in FIG. 6, when performing a read operation, the sensing node SO is first charged to a fixed voltage, and the sensing node SO is connected to the memory cell via a bit line. If the read voltage applied during the read operation can enable the memory cell to be turned on, the sensing node SO will be discharged due to the turning-on of the memory cell after a period of time ($\Delta T$ in FIG. 6). If the read voltage applied during the read operation cannot enable the memory cell to be turned on or only enables the memory cell to be turned on weakly, the sensing node SO will hardly be discharged after a period of time (such as $\Delta T$ in FIG. 6). Based on this, the channel current can be indirectly measured by sensing the voltage change $\Delta V_c$ of the node SO, so as to obtain the memory state of the memory cell.

Generally, data indicating the memory state of the memory cell is referred as hard data, which is a readout value of the bit stored in the memory cell and can be obtained by performing a read operation with a voltage ($V_{R1}$ in FIG. 7, for example) for distinguishing different memory states of the memory cell. Data indicating a position of a threshold voltage of the memory cell in the threshold voltage distribution corresponding to the memory state of the memory cell is referred as soft data, which can provide additional reliability information for the above hard data and is generated by sensing at an additional voltage between the read voltages corresponding to the hard data (for example, $V_{R1}-\Delta V$ and $V_{R1}+\Delta V$ in FIG. 8a). The value of the soft data indicates how close the threshold voltage of the memory cell is to the read voltage corresponding to the above-mentioned hard data.

Figure 7:
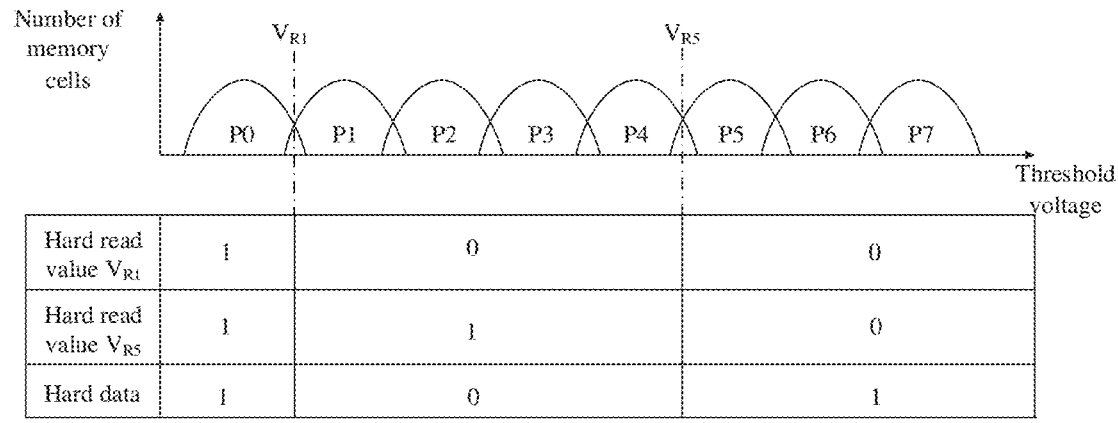
FIG. 7 is a schematic diagram of a hard data reading process, according to an example of the present disclosure.

The reading processes of hard data and soft data will be described below with reference to FIG. 7 and FIG. 8a. FIG. 7 is a schematic diagram of a hard data reading process, according to an example of the present disclosure. As shown in FIG. 7, taking Trinary-Level Cell (TLC) as an example, each memory cell can be configured to store 3-bit data in one of 8 memory states such as P0-P7 states. In TLC, each physical page corresponds to three logical pages, namely a lower page (LP), a middle page (MP) and an upper page (UP). For example, when performing a read operation on a memory cell to read hard data of a lower page, it is necessary to apply a read voltage $V_{R1}$ to the word line where the memory cell is located first. The read voltage $V_{R1}$ is used to distinguish the P0 state from the P1-P7 states. By detecting the discharge of the sensing node SO, a hard read value corresponding to $V_{R1}$ is obtained. In some examples, the memory cells whose threshold voltage is lower than the read voltage $V_{R1}$ have a hard read value of 1, and the memory cells whose threshold voltage is greater than the read voltage $V_{R1}$ have a hard read value of 0.

In some non-limiting examples, the hard read value of the memory cells whose threshold voltage is lower than the read voltage $V_{R1}$ is 0, and the hard read value of the memory cells whose threshold voltage is greater than the read voltage $V_{R1}$ is 1.

Then, the read voltage $V_{R5}$ is applied to the word line where the memory cell is located. The read voltage $V_{R5}$ is used to distinguish between P0-P4 states and P5-P7 states. By detecting the discharge of the sensing node SO, the hard read value corresponding to $V_{R5}$ is obtained. In some examples, the memory cells whose threshold voltage is lower than the read voltage $V_{R5}$ have a hard read value of 1, and the memory cells whose threshold voltage is greater than the read voltage $V_{R5}$ have a hard read value of 0. Finally, the hard read value corresponding to the read voltage $V_{R5}$ is inversed and then ORed with the hard read value corresponding to the read voltage $V_{R5}$ to obtain the hard data corresponding to the lower page.

Figure 8A:
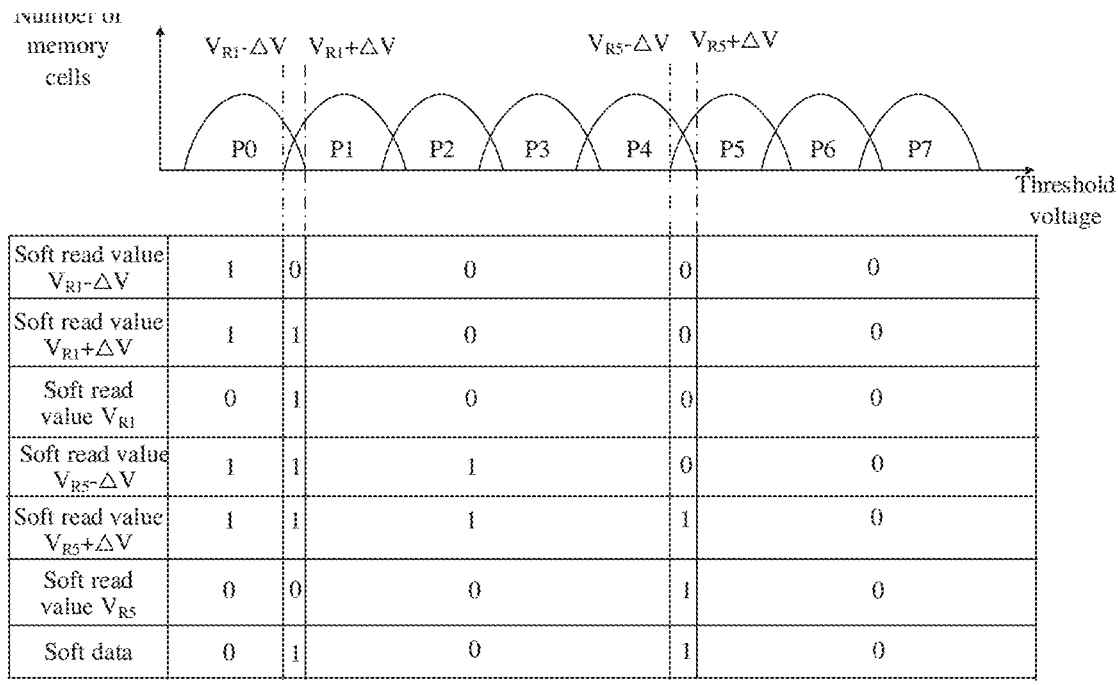
FIG. 8a is a schematic diagram of a soft data reading process, according to an example of the present disclosure.

FIG. 8a is a schematic diagram of a soft data reading process, according to an example of the present disclosure. As shown in FIG. 8a, taking reading the soft data of the lower page of the TLC as an example, it is necessary to apply a read voltage $V_{R1}-\Delta V$ to the word line where the memory cell to be read is located first to obtain a soft read value corresponding to the read voltage $V_{R1}-\Delta V$. The value of $\Delta V$ can be determined based on the threshold voltage distribution of each memory state of the TLC. When the threshold voltage of the memory cell is lower than the read voltage $V_{R1}-\Delta V$, the soft read value corresponding to $V_{R1}-\Delta V$ is 1; and when the threshold voltage of the memory cell is greater than the read voltage $V_{R1}-\Delta V$, the soft read value corresponding to $V_{R1}-\Delta V$ is 0. Then, a read voltage $V_{R1}+\Delta V$ is applied to the word line where the memory cell is located to obtain a soft read value corresponding to the read voltage $V_{R1}+\Delta V$. When the threshold voltage of the memory cell is lower than the read voltage $V_{R1}+\Delta V$, the soft read value corresponding to $V_{R1}+\Delta V$ is 1; and when the threshold voltage of the memory cell is greater than the read voltage $V_{R1}+\Delta V$, the soft read value corresponding to $V_{R1}+\Delta V$ is 0. The soft read value corresponding to the read voltage $V_{R1}-\Delta V$ is XORed with the soft read value corresponding to the read voltage $V_{R1}+\Delta V$ to obtain the soft read value corresponding to $V_{R1}$. When the threshold voltage of the memory cell is greater than $V_{R1}-\Delta V$ and lower than $V_{R1}+\Delta V$, the soft read value corresponding to $V_{R1}$ is 1, and when the threshold voltage of the memory cell is greater than $V_{R1}+\Delta V$ and lower than $V_{R1}-\Delta V$, the soft read value corresponding to $V_{R1}$ is 0.

Then, a read voltage $V_{R5}-\Delta V$ and a read voltage $V_{R5}+\Delta V$ are respectively applied to the word line where the memory cell to be read is located, so as to obtain a soft read value corresponding to $V_{R5}$. It should be understood that the method of obtaining the soft read value corresponding to $V_{R5}$ is similar to the above method of obtaining the soft read value corresponding to $V_{R1}$, so details are not repeated here. Finally, the soft read value corresponding to $V_{R1}$ is ORed with the soft read value corresponding to $V_{R5}$ to obtain the soft data of the lower page. Here, the above method of reading soft data is referred to as soft data single bit read (SDSBR).

As mentioned above, in order to obtain the hard data of the lower page of TLC, two read operations need to be performed, and in order to obtain the soft data of the lower page of TLC, four read operations need to be performed. Since the word line and the bit line where the memory cell to be read is located need to be set accordingly for each read operation, therefore the reading time needed may be relatively long.

FIG. 8b is a schematic diagram of use status of latches in a page buffer during a soft data reading storage process, according to an example of the present disclosure. As shown in FIG. 8b, the page buffer in TLC includes a master latch DS, a bias latch DL and three data latches (D1, D2 and DC in FIG. 8b). After the read operation is performed with the read voltage $V_{R1}-\Delta V$, the soft read value data1 corresponding to $V_{R1}-\Delta V$ is stored in the data latch DL. At this time, inhibition information corresponding to $V_{R5}-\Delta V$ obtained after the read operation performed with the read voltage $V_{R1}-\Delta V$ is stored in the bias latch DL. The inhibition information corresponding to $V_{R5}-\Delta V$ is used to indicate that when performing the read operation corresponding to the P5 state (performing the read operation with the read voltage $V_{R5}-\Delta V$), a read inhibition voltage is applied to the bit line of the memory cell whose threshold voltage is lower than the read voltage $V_{R1}-\Delta V$ and is in the same word line as the memory cell to be read.

After the read operation is performed with the read voltage $V_{R1}+\Delta V$, data data2 is stored in the data latch DC. The Data2 is the result of XOR operation of the soft read value corresponding to $V_{R1}-\Delta V$ and the soft read value corresponding to $V_{R1}+\Delta V$. At this time, inhibition information corresponding to $V_{R5}+\Delta V$ obtained after the read operation performed with the read voltage $V_{R1}+\Delta V$ is stored in the data latch D1. The inhibition information corresponding to $V_{R5}+\Delta V$ is used to indicate that when performing the read operation with the read voltage $V_{R5}+\Delta V$, a read inhibition voltage is applied to the bit line of the memory cell whose threshold voltage is lower than the read voltage $V_{R1}+\Delta V$ and is in the same word line as the memory cell to be read. The inhibition information corresponding to $V_{R5}-\Delta V$ is stilled stored in the bias latch DL.

When the read operation is performed with the read voltage $V_{R5}-\Delta V$, the inhibition information corresponding to $V_{R5}-\Delta V$ is dumped from the bias latch DL into the master latch DS, and a read inhibition voltage is applied to the bit line of the memory cell whose threshold voltage is lower than the read voltage $V_{R1}-\Delta V$ and is in the same word line as the memory cell to be read based on the inhibition information corresponding to $V_{R5}-\Delta V$. After the read operation is performed with the read voltage $V_{R5}-\Delta V$, the soft read value data3 corresponding to $V_{R5}-\Delta V$ is stored in the data latch D2. At this time, the inhibition information corresponding to $V_{R5}-\Delta V$, the inhibition information corresponding to $V_{R5}+\Delta V$ and the data data2 are still stored in the bias latch DL, the data latch D1 and the data latch DC respectively.

When the read operation is performed with the read voltage $V_{R5}+\Delta$, the inhibition information corresponding to $V_{R5}+\Delta V$ is dumped from the data latch D1 into the master latch DS, and a read inhibition voltage is applied to the bit line of the memory cell whose threshold voltage is lower than the read voltage $V_{R1}+\Delta V$ and is in the same word line as the memory cell to be read based on the inhibition information corresponding to $V_{R5}+\Delta$. After the read operation is performed with the read voltage $V_{R5}+\Delta$, the soft data data4 is stored in the data latch DC. The soft data data4 is the result of the XORing operation of the soft read value corresponding to $V_{R5}+\Delta$ and the soft read value data3 corresponding to $V_{R5}-\Delta V$ and then the ORing operation with the data data2. At this time, the inhibition information corresponding to $V_{R5}-\Delta V$ and the inhibition information corresponding to $V_{R5}+\Delta V$ are still stored in the bias latch DL and the data latch D1 respectively.

In the process of obtaining the soft data of the lower page, at least five latches need to be occupied. Moreover, since hard data and soft data need to be obtained separately through different read operations, it is impossible to meet the requirement of caching hard data and soft data simultaneously.

To this end, an example of the present disclosure provides a method of controlling a memory. FIG. 9 illustrates a schematic flowchart of a method of controlling a memory, according to an example of the present disclosure. The memory includes a plurality of memory cells, and each memory cell is configured to store N-bit data, where N is an integer greater than 1. As shown in FIG. 9, at operation 901, performing a read operation based on a read voltage corresponding to a target logical page to obtain a hard read value and a soft read value of the target logical page, and storing the hard read value, the soft read value and inhibition information into three latches in a page buffer respectively.

The target logical page is the logical page on which a read operation is to be performed. For example, when N is 3, that is, in TLC, one physical page corresponds to three logical pages, namely a lower page (LP), a middle page (MP) and an upper page (UP), and the target logical page can be any one of the lower page, the middle page and the upper page. When N is 4, that is, in Quad-Level Cell (QLC), one physical page corresponds to four logical pages, namely a lower page (LP), a middle page (MP), an upper page (UP) and an extra page (XP), and the target logical page can be any one of the lower page, the middle page, the upper page and the extra page.

Each target logical page corresponds to at least one read voltage. For example, when N is 3, each memory cell is configured to store 3-bit data in one of 8 memory states, and a first read voltage to a seventh read voltage are used to distinguish the 8 memory states. The first reading voltage to the seventh reading voltage increase sequentially. When N is 3, one physical page corresponds to three logical pages, and a first logical page of the three logical pages corresponds to the first read voltage and a fifth read voltage. A second logical page of the three logical pages corresponds to a second read voltage, a fourth read voltage, and a sixth read voltage, and a third logical page of the three logical pages corresponds to a third read voltage and the seventh read voltage. Here, the first logical page may be the lower page of the TLC, the second logical page may be the middle page of the TLC, and the third logical page may be the upper page of the TLC.

In some examples, the hard read voltage and the soft read voltage are respectively applied to the memory cell to obtain the hard read value and the soft read value of the target logic page respectively. The lower page of TLC is taken as an example for illustration. A first hard read voltage (e.g., a first read voltage $V_{R1}$) is applied to the memory cell to obtain a first hard read value, and then a first soft read voltage is applied to the memory cell to obtain a first soft read value, where the first soft read voltage may be a voltage greater than the first hard read voltage by a preset value (for example, $V_{R1}+\Delta V$). A second hard read voltage (for example, the fifth read voltage $V_{R5}$) is applied to the memory cell to obtain a second hard read value, and then a second soft read voltage is applied to the memory cell to obtain a second soft read value, where the second soft read voltage may be a voltage greater than the second hard read voltage by a preset value (for example, $V_{R5}+\Delta$).

In some other examples, performing the read operation based on the read voltages corresponding to the lower page (the first read voltage and the fifth read voltage) includes two continuous sensings. For example, the read operation performed based on the first read voltage corresponding to the lower page includes a first sensing and a second sensing that are continuous. By setting sensing time of the first sensing to be less than sensing time of the second sensing, such that in the first sensing, a read value of the memory cell whose the threshold voltage is smaller than a voltage (for example, $V_{R1}+\Delta V$) that is greater than the first read voltage by a preset value is 1, and a read value of the memory cell whose threshold voltage is greater than a voltage (for example, $V_{R1}+\Delta V$) that is greater than the first read voltage by a preset value is 0; and in the second sensing, a read value of the memory cell whose threshold voltage is lower than the first read voltage (for example, $V_{R1}$) is 1, and a read value of the memory cell whose threshold voltage is greater than the first read voltage (for example, $V_{R1}$) is 0. Thus, by applying a read voltage once, a read operation including two continuous sensings can be performed to obtain read values corresponding to two different voltages (for example, a first hard read value and a first soft read value).

The read operation performed based on the read voltage corresponding to the target logical page at operation 901 may include two continuous sensings. FIG. 10 is a schematic diagram of continuous sensing, according to an example of the present disclosure. As shown in FIG. 10, the horizontal axis represents time, and the vertical axis represents voltage. The graph in FIG. 10 represents the voltage variation at the sensing node SO. T1-T2 is the first sensing of the two continuous sensings, and T2-T3 is the process of obtaining a hard read value by discharging the sensing node SO in the first sensing. T3-T4 is the second sensing in the two continuous sensings, and T4-T5 is the process of obtaining a soft read value by discharging the sensing node SO in the second sensing. The sensing time of the first sensing is less than the sensing time of the second sensing, that is, (T2−T1)<(T4−T3).

The page buffer includes a master latch DS, a bias latch DL, and N data latches. In some examples, the hard read value, the soft read value, and the inhibition information are stored in the bias latch DL, a first data latch of the N data latches, and the master latch DS, respectively. The first data latch is any one of the N data latches. In other examples, the hard read value, the soft read value, and the inhibition information are stored in the first data latch, the bias latch DL and the master latch DS, respectively. In an example, taking reading the lower page data of the TLC as an example, in some examples, the read operation is performed based on the first hard read voltage and the first soft read voltage respectively, so as to obtain the first hard read value and the first soft read value. Meanwhile, the inhibition information corresponding to the second hard read voltage can also be obtained by performing the read operation based on the first soft read voltage, where the inhibition information corresponding to the second hard read voltage is used to indicate that when the read operation is subsequently performed with the second hard read voltage, a read inhibition voltage is applied to the bit line of the memory cell whose threshold voltage is lower than the first soft read voltage and is in the same word line as the memory cell to be read. Then, the inhibition information corresponding to the first hard read value, the first soft read value and the second hard read voltage are stored in the bias latch DL, the first latch of the three data latches and master latch DS respectively.

In other examples, a read operation is performed based on the first read voltage to obtain a first hard read value and a first soft read value. Meanwhile, by performing the read operation based on the first read voltage, the first inhibition information can also be obtained. The first inhibition information is used to indicate that when the read operation is subsequently performed with the fifth read voltage, a read inhibition voltage is applied to the bit line of the memory cell whose threshold voltage is lower than the first read voltage that in the same word line as the memory cell to be read. Then, the first hard read value, the first soft read value, and the first inhibition information are stored in the bias latch DL, the first latch of the three data latches, and the master latch DS, respectively.

At operation 902, the hard data of the target logical page is obtained based on the hard read value of the target logical page.

In an example, taking reading the hard data of the lower page of the TLC as an example, after the read operation is performed based on the first hard read voltage, the first soft read voltage, the second hard read voltage and the second soft read voltage respectively to obtain the first hard read value, the first soft read value, the second hard read value, and the second soft read value, or, after the read operation is performed based on the first read voltage to obtain a first hard read value and the first soft read value; and after the read operation is performed based on the fifth read voltage to obtain the second hard read value and the second soft read value, the second hard read value is inversed and then ORed with the first hard read value to obtain a result as the hard data of the lower page. For example, the first hard read value is A, the second hard read value is B, and hard data is HD=A+$\overline{B}$.

In some examples, the master latch DS is released after the hard data is obtained. Therefore, after obtaining the soft data, the master latch DS can store the soft data.

At operation 903, the soft data of the target logical page is obtained based on the hard data and the soft read value of the target logical page.

In an example, taking reading the soft data of the lower page of the TLC as an example, the second soft read value is inversed and then ORed with the first soft read value to obtain a result, which is XORed with the above hard data of the lower page to obtain the soft data of the lower page. For example, the first soft read value is C, the second soft read value is D, the hard data is HD, and the soft data is SD=HD XOR (C+$\overline{D}$).

In some examples, after obtaining the soft data, the soft data is stored into the master latch DS.

Compared with the related art where the hard read value and the soft read value are obtained separately through different read operations, the present disclosure obtains the hard read value and the soft read value through one read operation simultaneously, the hard data and soft data are obtained with the hard read value and the soft read value obtained by each read operation, which can avoid the longer setting time of word lines and bit lines caused by more read operations, thereby reducing the reading time. Moreover, only three latches need to be occupied to store hard read values, soft read values and inhibition information during the obtaining of hard data and soft data in accordance with the present disclosure, and then more latches can be reserved for the reading of data of next logical page.

In some examples, after storing the soft data in the master latch DS, the hard data is dumped from the bias latch DL or the first data latch into the second data latch of the N data latches, the soft data is dumped from the master latch DS into the third data latch of the N data latches, and the bias latch DL, the first data latch and the master latch DS are released. The first data latch, the second data latch and the third data latch are different data latches of the N data latches. Here, prior to the read operation of the data of the next logical page, the hard data may be dumped from the bias latch DL into the second data latch of the N data latches, the soft data may be dumped from the master latch DS into the third data latch of the N data latches, and the bias latch DL, the first data latch, and the master latch DS are released.

In accordance with the present disclosure, hard data is dumped from the bias latch DL into the second data latch of the N data latches, the soft data is dumped from the master latch DS into the third data latch of the N data latches, and the bias latch DL, the first data latch and the master latch DS are released, thereby the released bias latch DL, the first data latch and the master latch DS are used in reading the next logical page.

Figure 11:
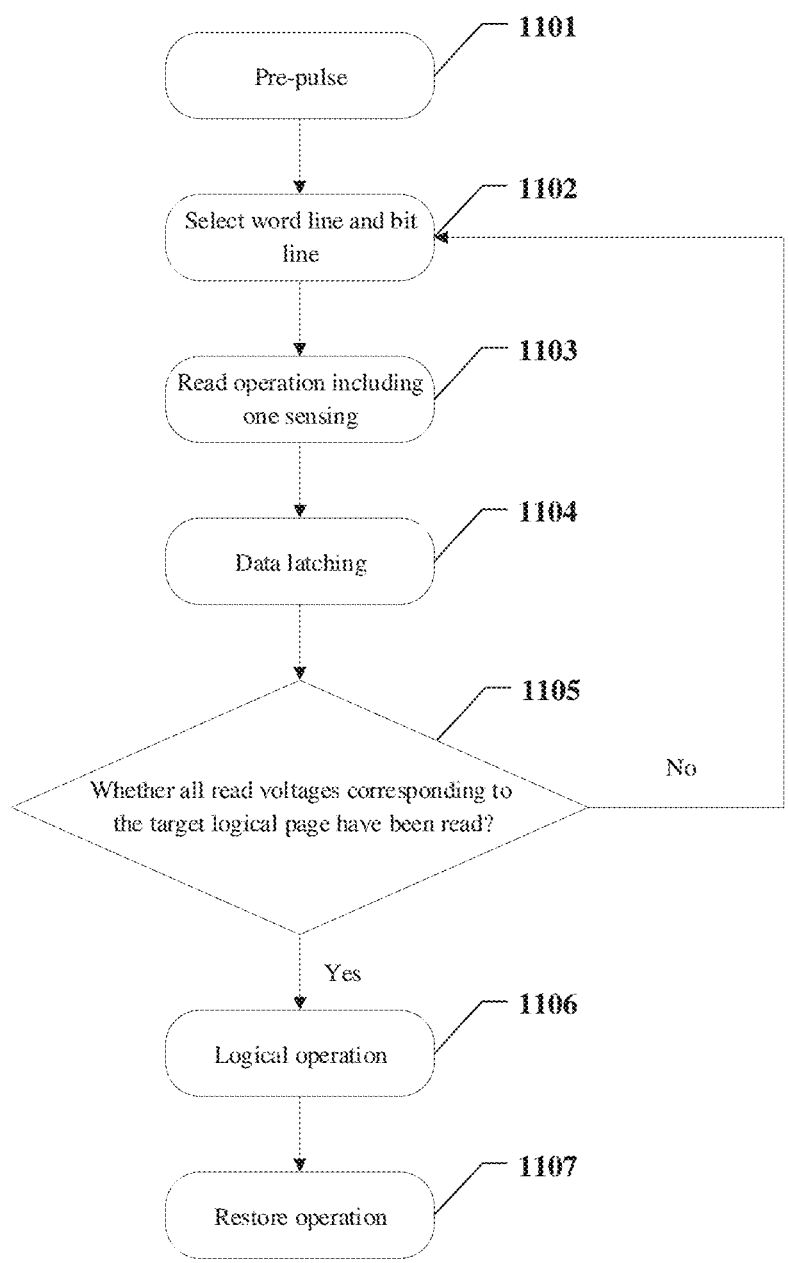
FIG. 11 is a schematic flowchart of a method of controlling a memory, according to an example of the present disclosure.

FIG. 11 is a schematic flowchart of a method of controlling a memory according to an example of the present disclosure. As shown in FIG. 11, at operation 1101, a prepulse operation is performed. In some examples, before performing the read operation, a pass voltage may be applied to a selected word line (that is, the word line where the memory cell to be read is located) and a non-selected word line, to turn on the selected word line and the non-selected word line and turn off the bottom selective transistor and the top selective transistor of at least one of a selected memory string (that is, the memory string where the memory cell to be read is located) or a non-selected memory string, so that a substantially uniform charge distribution is established in the channels of the memory cells of each memory string through charge sharing, thereby reducing the degree of read disturbance and preventing Hot Carrier Injection (HCI) crosstalk between memory strings.

At operation 1102, word lines and bit lines are selected. The row driver is operable in response to a row address signal from the control circuit to generate a word line signal to select a word line for a read operation. The column drivers are operable in response to a column address signal from the control circuit to generate a bit line signal to select a bit line for a read operation. In this way, the target memory cell can be selected through the selected word line and bit line. During the read operation, a read voltage can be applied to the target memory cell via the selected word line, and a current signal can be sensed from the target memory cell via the selected bit line to read data from the target memory cell. For example, taking reading the data of the lower page of TLC as an example, the first read voltage or the fifth read voltage can be applied to the selected word line, a pass voltage can be applied to the unselected word line, a read inhibition voltage is applied to the bit line where the read-inhibited memory cell is located based on inhibition information (for example, the first inhibition information in FIG. 15b), and then data of the target memory cell can be read by detecting the sense current of the bit line where the target memory cell is located.

At operation 1103, a read operation including one sensing is performed. For example, a read operation is performed based on a first hard read voltage to obtain a first hard read value.

At operation 1104, data latching is performed. The hard read value, the soft read value, and the inhibition information are stored in the bias latch DL, the first data latch of the N data latches, and the master latch DS, respectively.

At operation 1105, it is determined whether all read voltages corresponding to the target logical page have been read. For example, taking reading the data of the lower page of TLC as an example, if a read operation has been performed with the first hard read voltage, the first soft read voltage, the second hard read voltage and the second soft read voltage, step 1106 is performed; if there is a read voltage with which the read operation is not performed in the first hard read voltage, the first soft read voltage, the second hard read voltage, and the second soft read voltage, steps 1102-1104 are performed based on the read voltage on which the read operation is not performed to obtain its corresponding hard read value and soft read value.

At operation 1106, logical operations are performed to obtain soft data. For example, taking reading the data of the lower page of TLC as an example, the second hard read value is inversed and then is ORed with the first hard read value to obtain a result as the hard data of the lower page. For example, the first hard read value is A, the second hard read value is B, then the hard data is HD=A+$\overline{B}$. The second soft read value is inversed and then ORed with the first soft read value to obtain a result which is XORed with the hard data of the lower page above to obtain the soft data of the lower page. For example, the first soft read value is C, the second soft read value is D, then soft data is SD=hard data HD XOR (C+$\overline{D}$).

At operation 1107, a restore operation is performed. In some examples, the voltages of the selected word line or unselected word line and the voltages of the selected bit line or unselected bit line are restored to an initial voltage, which may be 0V.

Figure 12A:
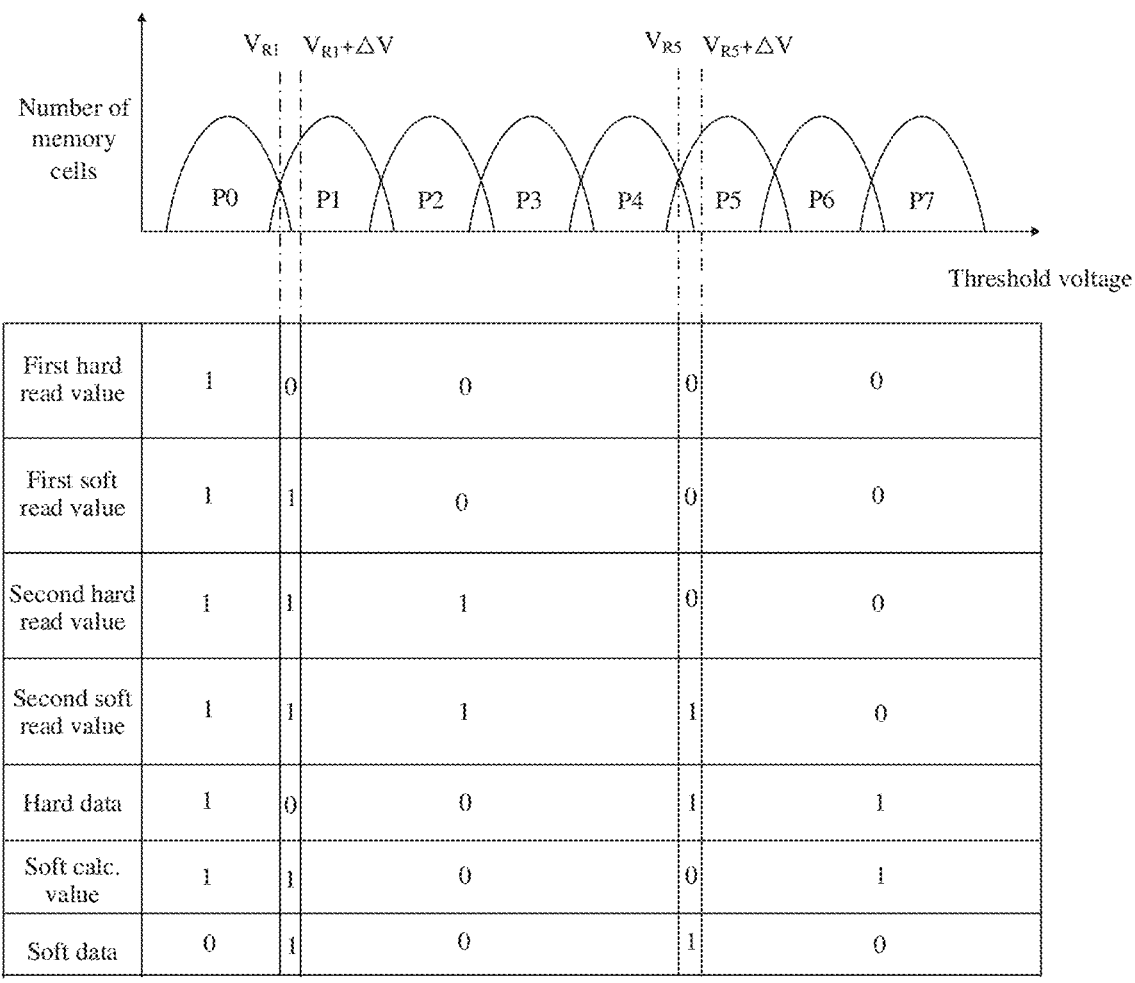
FIG. 12a is a schematic diagram of a process of reading data of lower page of TLC, according to an example of the present disclosure.

FIG. 12a is a schematic diagram of a process of reading data of lower page of TLC according to an example of the present disclosure. As shown in FIG. 12a, a first hard read voltage is applied to the selected word line first, where the first hard read voltage may be $V_{R1}$ shown in FIG. 12a. As shown in FIG. 12a, when the threshold voltage of the memory cell is lower than the first hard read voltage $V_{R1}$, the first hard read value is 1, and when the threshold voltage of the memory cell is greater than the first hard read voltage $V_{R1}$, the first hard read value of the memory cell is 0. Then, a first soft read voltage is applied to the selected word line, where the first soft read voltage can be $V_{R1}+\Delta V$ shown in FIG. 12a and the value of $\Delta V$ may be determined based on the threshold voltage distribution of each memory state of TLC. When the threshold voltage of the memory cell is lower than the first soft read voltage $V_{R1}+\Delta V$, the first soft read value is 1, and when the threshold voltage of the memory cell is greater than the first soft read voltage $V_{R1}+\Delta V$, the first soft read value is 0. In other examples, when the threshold voltage of the memory cell is lower than the first hard read voltage $V_{R1}$, the first hard read value is 0, and when the threshold voltage of the memory cell is greater than the first hard read voltage $V_{R1}$, the first hard read value is 1. When the threshold voltage of the memory cell is lower than the first soft read voltage $V_{R1}+\Delta V$, the first soft read value is 0, and when the threshold voltage of the memory cell is greater than the first soft read voltage $V_{R1}+\Delta V$, the first soft read value is 1, the present disclosure is not limited to this.

A second hard read voltage (e.g., $V_{R5}$ in FIG. 12a) is applied to the selected word line to obtain a second hard read value. When the threshold voltage of the memory cell is lower than the second hard read voltage $V_{R5}$, the second hard read value is 1, and when the threshold voltage of the memory cell is greater than the second hard read voltage $V_{R5}$, the second hard read value is 0. A second soft read voltage (e.g., $V_{R5}+\Delta V$ in FIG. 12a) is applied to the selected word line to obtain a second soft read value. When the threshold voltage of the memory cell is lower than the second soft read voltage $V_{R5}+\Delta$, the second soft read value is 1, and when the threshold voltage of the memory cell is greater than the second soft read voltage $V_{R5}+\Delta$, the second soft read value is 0.

The second hard read value is inversed and then ORed with the first hard read value to obtain a result as the hard data of the lower page. For example, the first hard read value is A, the second hard read value is B, then the hard data is HD=A+$\overline{B}$. The second soft read value is inversed and then ORed with the first soft read value to obtain a result as a soft calculation value. For example, the first soft read value is C, the second soft read value is D, then the soft calculation value is E, E=C+$\overline{D}$. Next, the soft calculation value is XORed with the hard data of the lower page above to obtain the soft data of the lower page. That is, soft data is SD=HD XOR E=HD XOR (C+$\overline{D}$). The first hard read value and the second hard read value constitute the hard read value of the lower page of TLC, and the first soft read value and the second soft read value constitute the soft read value of the lower page of TLC.

FIG. 12b is a schematic diagram of use status of the latches in the page buffer during the storage process of reading data of the lower page of TLC, according to an example of the present disclosure. As shown in FIG. 12b, the page buffer of TLC includes a master latch DS, a bias latch DL and three data latches (D1, D2 and DC in FIG. 12b). After the read operation is performed with the first hard read voltage $V_{R1}$, the first hard read value is stored in the bias latch DL. At this time, inhibition information corresponding to the first soft read voltage obtained by performing a read operation with the first hard read voltage $V_{R1}$ is stored in the master latch DS. The inhibition information corresponding to the first soft read voltage is used to indicate that when performing a read operation with the first soft read voltage, a read inhibition voltage is applied to the memory cell whose threshold value is lower than the first hard read voltage $V_{R1}$ and is on the selected word line.

When the read operation is performed with the first soft read voltage $V_{R1}+\Delta V$, the read inhibition voltage is applied to the memory cell whose the threshold voltage is lower than the first hard read voltage $V_{R1}$ and is on the selected word line based on the inhibition information corresponding to the first soft read voltage stored in the master latch DS. After the read operation is performed with the first soft read voltage $V_{R1}+\Delta V$, the first soft read value is stored in the first data latch D1. Here, the first hard read value is still stored in the bias latch DL. At this time, inhibition information corresponding to the second hard read voltage obtained by performing a read operation with the first soft read voltage is stored in the master latch DS. The inhibition information corresponding to the second hard read voltage is used to indicate that when performing the read operation with the second hard read voltage, the read inhibition voltage is applied to the memory cell whose threshold voltage is lower than $V_{R1}+\Delta V$ and is on the selected word line.

When performing a read operation with the second hard read voltage $V_{R5}$, the read inhibition voltage is applied to the memory cell whose threshold voltage is lower than $V_{R1}+\Delta V$ and is on the selected word line based on the inhibition information corresponding to the second hard read voltage stored in the master latch DS. After the read operation is performed with the second hard read voltage $V_{R5}$, the hard data is stored in the bias latch DL. Here, the first soft read value is still stored in the first data latch D1. At this time, inhibition information corresponding to the second soft read voltage obtained by performing the read operation with the second hard read voltage $V_{R5}$ is stored in the master latch DS. The inhibition information corresponding to the second soft read voltage is used to indicate that when performing the read operation with the second soft read voltage, the read inhibition voltage is applied to the memory cell whose threshold voltage is lower than $V_{R5}$ and is on the selected word line.

When the read operation is performed with the second soft read voltage $V_{R5}+\Delta$, the read inhibition voltage is applied to the memory cell whose threshold voltage is lower than $V_{R5}$ and is on the selected word line based on the inhibition information corresponding to the second soft read voltage stored in the master latch DS. After the read operation is performed with the second soft read voltage $V_{R5}+\Delta$, the soft calculation value is stored in the first data latch D1, and the master latch DS is released. The hard data is XORed with the soft calculation value to obtain soft data, and the soft data is stored into the master latch DS. In some examples, after storing the soft data in the master latch DS, the hard data is dumped from the bias latch DL into the second data latch D2, and the soft data is dumped from the master latch DS into the third data latch DC, and the bias latch DL, the first data latch D1 and the master latch DS are released to be used for reading the next logical page data. Here, prior to a read operation on data of the next logical page, the hard data may be dumped from the bias latch DL into the second data latch D2, the soft data may be dumped from the master latch DS into the third latch DC, and the bias latch DL, the first data latch D1 and the master latch DS can be released.

As mentioned above, compared with the related art in which two read operations need to be performed respectively to obtain the hard data of the lower page of TLC, and four read operations need to be performed respectively to obtain the soft data of the lower page of TLC, only four read operations need to be performed to obtain both the hard data and soft data when using the method of controlling the memory according to the examples of the present disclosure to read the hard data and soft data of the lower page of TLC. Since the number of read operations is reduced, the setting time of the word line and the bit line required for the read operation can be reduced, thereby reducing the reading time. Furthermore, when reading the hard data and soft data of the lower page of TLC, the present disclosure only needs to occupy three latches (such as the master latch DS, the bias latch DL and the first data latch D1 shown in FIG. 12b), which allows reservation of more latches for reading the data of the next logical page.

Figure 13A:
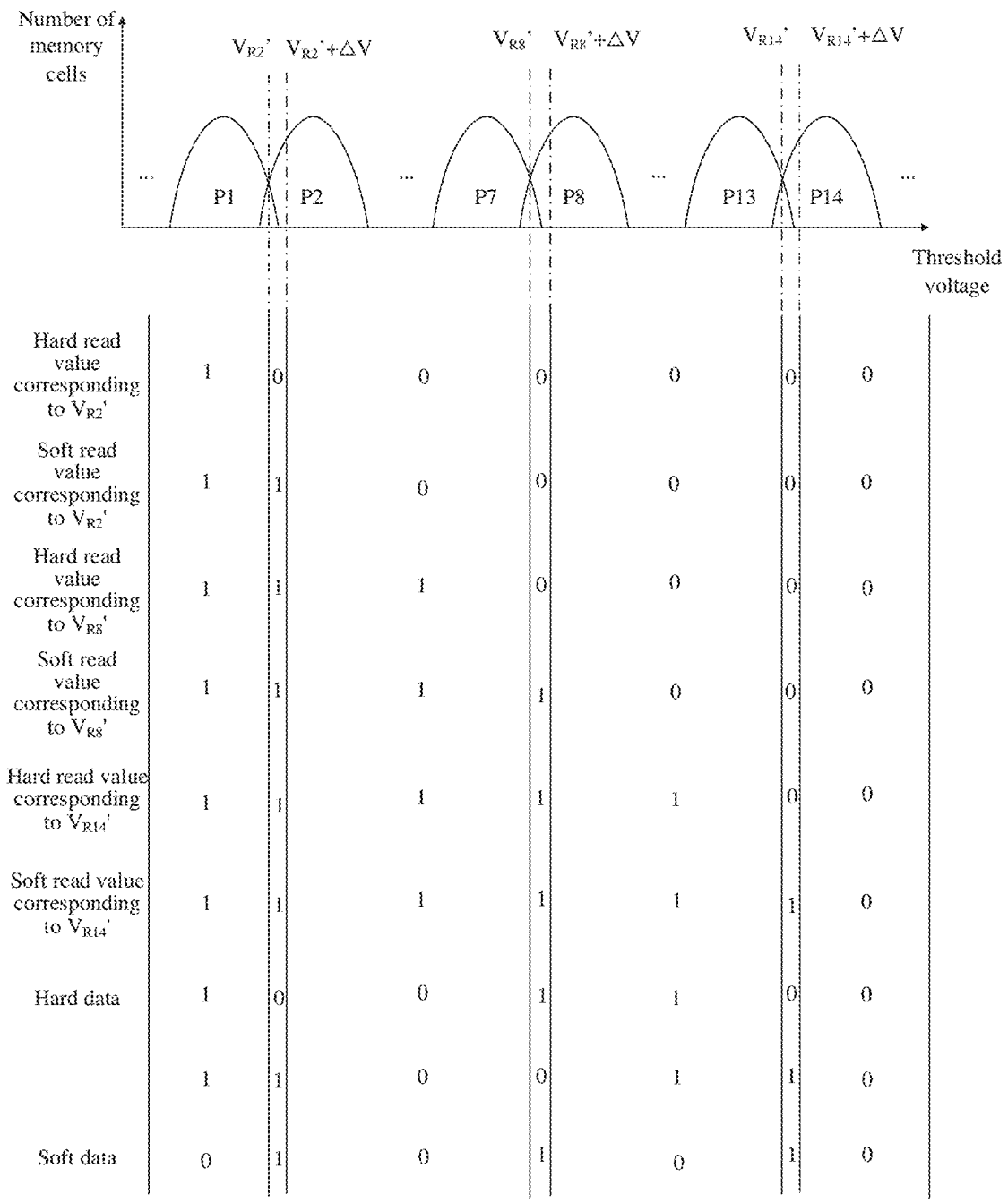
FIG. 13a is a schematic diagram of a process of reading data of lower page of QLC, according to an example of the present disclosure.

FIG. 13a is a schematic diagram of a process of reading data of lower page of QLC, according to an example of the present disclosure. In QLC, each memory cell is configured to store 4-bit data in any one of 16 memory states (e.g., P0-P15 states). Sequentially increasing read voltages $V_{R1}'$-$V_{R15}'$ are used to distinguish 16 memory states, where the lower page corresponds to read voltages $V_{R2}'$, $V_{R8}'$ and $V_{R14}'$. The read voltage $V_{R2}'$ is used to distinguish memory states P0-P1 and P2-P15, the read voltage $V_{R8}'$ is used to distinguish memory states P0-P7 and P8-P15, and the read voltage $V_{R14}'$ is used to distinguish memory states P0-P13 and P14-P15. It should be noted that only the threshold voltage distributions corresponding to the memory states P1, P2, P7, P8, P13, and P14 are shown in FIG. 13a. As shown in FIG. 13a, read voltages $V_{R2}'$, $V_{R2}'+\Delta V$, $V_{R8}'$, $V_{R8}'+\Delta V$, $V_{R14}'$, and $V_{R14}'+\Delta V$ are respectively applied to the selected word line to obtain hard read value and soft read value corresponding to $V_{R2}'$, hard read value and soft read value corresponding to $V_{R8}'$, and hard read value and soft read value corresponding to $V_{R14}'$.

When the threshold voltage of the memory cell is lower than the read voltage $V_{R2}'$, the hard read value corresponding to $V_{R2}'$ is 1, and when the threshold voltage of the memory cell is greater than the read voltage $V_{R2}'$, the hard read value corresponding to $V_{R2}'$ is 0. When the threshold voltage of the memory cell is lower than the read voltage $V_{R2}'+\Delta V$, the soft read value corresponding to $V_{R2}'$ is 1, and when the threshold voltage of the memory cell is greater than the read voltage $V_{R2}'+\Delta V$, the soft read value corresponding to $V_{R2}'$ is 0. When the threshold voltage of the memory cell is lower than the read voltage $V_{R8}'$, the hard read value corresponding to $V_{R8}'$ is 1, and when the threshold voltage of the memory cell is greater than the read voltage $V_{R8}'$, the hard read value corresponding to $V_{R8}'$ is 0. When the threshold voltage of the memory cell is lower than the read voltage $V_{R8}'+\Delta V$, the soft read value corresponding to $V_{R8}'$ is 1, and when the threshold voltage of the memory cell is greater than the read voltage $V_{R8}'+\Delta V$, the soft read value corresponding to $V_{R8}'$ is 0. When the threshold voltage of the memory cell is lower than the read voltage $V_{R14}'$, the hard read value corresponding to $V_{R14}'$ is 1, and when the threshold voltage of the memory cell is greater than the read voltage $V_{R14}'$, the hard read value corresponding to $V_{R14}'$ is 0. When the threshold voltage of the memory cell is lower than the read voltage $V_{R8}'+\Delta V$, the soft read value corresponding to $V_{R14}'$ is 1, and when the threshold voltage of the memory cell is greater than the read voltage $V_{R14}'+\Delta V$, the soft read value corresponding to $V_{R14}'$ is 0. The hard read value corresponding to $V_{R2}'$, the hard read value corresponding to $V_{R8}'$, and the hard read value corresponding to $V_{R14}'$ as described above constitute the hard read value of the lower page of QLC, and the soft read value corresponding to $V_{R2}'$, the soft read value corresponding to $V_{R8}'$ and the soft read value corresponding to $V_{R14}'$ constitute the soft read value of the lower page of QLC.

The hard read value corresponding to $V_{R8}'$ is inversed and ORed with the hard read value corresponding to $V_{R2}'$ to obtain a result, and then the result is ANDed with the hard read value corresponding to $V_{R14}'$ to obtain the hard data. For example, the hard read value corresponding to $V_{R2}'$ is A, the hard read value corresponding to $V_{R8}'$ is B, the hard read value corresponding to $V_{R14}'$ is C, then the hard data is HD=(A+$\overline{B}$) & C.

The soft read value corresponding to $V_{R8}'$ is inversed and ORed with the soft read value corresponding to $V_{R2}'$ to obtain a result; and then the result is ANDed with the soft read value corresponding to $V_{R14}'$ to obtain a soft calculation value. For example, the soft read value corresponding to $V_{R2}'$ is D, the soft read value corresponding to $V_{R8}'$ is E, the soft read value corresponding to $V_{R14}'$ is F, then the soft calculation value is G=(D+$\overline{E}$) & F.

The above hard data is XORed with the soft calculation value to obtain a result as the soft data of the lower page of QLC. That is, soft data SD=hard data HD XOR soft calculation value G.

FIG. 13b is a schematic diagram of use status of the latches in the page buffer during the storage process of reading data of lower page of QLC, according to an example of the present disclosure. As shown in FIG. 13b, the page buffer of QLC includes a master latch DS, a bias latch DL and four data latches (D1, D2, D3 and DC in FIG. 13b). After performing the read operation with $V_{R2}'$, the hard read value corresponding to $V_{R2}'$ is stored into the bias latch DL. At this time, inhibition information corresponding to $V_{R2}'+\Delta V$ obtained after performing the read operation with $V_{R2}'$ is stored in the master latch DS. The inhibition information corresponding to $V_{R2}'+\Delta V$ is used to indicate that when a read operation is performed with $V_{R2}'+\Delta V$, a read inhibition voltage is applied to the memory cell whose threshold voltage is lower than the read voltage $V_{R2}'$ and is on the selected word line.

When performing the read operation with $V_{R2}'+\Delta V$, the read inhibition voltage is applied to the memory cell whose threshold voltage is lower than the read voltage $V_{R2}'$ and is on the selected word line based on the inhibition information corresponding to $V_{R2}'+\Delta V$ in the master latch DS. After the read operation is performed with $V_{R2}'+\Delta V$, the soft read value corresponding to $V_{R2}'$ is stored in the first data latch D1. Here, the hard read value corresponding to $V_{R2}'$ is still stored in the bias latch DL. At this time, inhibition information corresponding to $V_{R8}'$ obtained by performing the read operation with $V_{R2}'+\Delta V$ is stored in the master latch DS. The inhibition information corresponding to $V_{R8}'$ is used to indicate that when a read operation is performed with $V_{R8}'$, the read inhibition voltage is applied to the memory cell whose threshold voltage is lower than the read voltage $V_{R2}'+\Delta V$ and is on the selected word line.

When performing the read operation with $V_{R8}'$, the read inhibition voltage is applied to the memory cell whose threshold voltage is lower than the read voltage $V_{R2}'+\Delta V$ and is on the selected word line based on the inhibition information corresponding to $V_{R8}'$ in the master latch DS. After the read operation is performed with $V_{R8}'$, data Data1' is stored in the bias latch DL, where the data Data1' is a result obtained by inversing the hard read value corresponding to $V_{R8}'$ and ORing it with the hard read value corresponding to $V_{R2}'$. For example, the hard read value corresponding to $V_{R2}'$ is A, the hard read value corresponding to $V_{R8}'$ is B, then Data1'=A+$\overline{B}$. Here, the soft read value corresponding to $V_{R2}'$ is still stored in the first data latch D1. At this time, inhibition information corresponding to $V_{R8}'+\Delta V$ obtained by performing the read operation with $V_{R8}'$ is stored in the master latch DS. The inhibition information corresponding to $V_{R8}'+\Delta V$ is used to indicate that when a read operation is performed with $V_{R8}'+\Delta V$, the read inhibition voltage is applied to the memory cell whose threshold voltage is lower than the read voltage $V_{R8}'$ and is on the selected word line.

When performing the read operation with $V_{R8}'+\Delta V$, the read inhibition voltage is applied to the memory cell whose threshold voltage is lower than the read voltage $V_{R8}'$ and is on the selected word line based on the inhibition information corresponding to $V_{R8}'+\Delta V$ in the master latch DS. After the read operation is performed with $V_{R8}'+\Delta V$, data Data2' is stored in the data latch D1, where the data Data2' is the result obtained by inversing the soft read value corresponding to $V_{R8}'$ and ORing it with the soft read value corresponding to $V_{R2}'$. For example, the soft read value corresponding to $V_{R2}'$ is D, the soft read value corresponding to $V_{R8}'$ is F, then Data2'=D+$\overline{F}$. At this point, the data Data1' is still stored in the bias latch DL. At this time, inhibition information corresponding to $V_{R14}'$ obtained by performing a read operation with $V_{R8}'+\Delta V$ is stored in the master latch DS. The inhibition information corresponding to $V_{R14}'$ is used to indicate that when a read operation is performed with $V_{R14}'$, the read inhibition voltage is applied to the memory cell whose threshold voltage is lower than the read voltage $V_{R8}'+\Delta V$ and is on the selected word line.

When performing the read operation with $V_{R14}'$, the read inhibition voltage is applied to the memory cell whose threshold voltage is lower than the read voltage $V_{R8}'+\Delta V$ and is on the selected word line based on the inhibition information corresponding to $V_{R14}'$ stored in the master latch DS. When the read operation is performed with $V_{R14}'$, the hard data is stored in the bias latch DL. The hard data is the result obtained by ANDing the above data Data1' and the hard read value corresponding to $V_{R14}'$. For example, when the hard read value corresponding to $V_{R14}'$ is C, then the hard data is HD=Data1' & C. Here, the data Data2' is still stored in the data latch D1. At this time, inhibition information corresponding to $V_{R14}'+\Delta V$ obtained by performing the read operation with $V_{R14}'$ is stored in the master latch DS. The inhibition information corresponding to $V_{R14}'+\Delta V$ is used to indicate that when a read operation is performed with $V_{R14}'+\Delta V$, the read inhibition voltage is applied to the memory cell whose threshold voltage is lower than the read voltage $V_{R14}'$ and is on the selected word line.

When the read operation is performed with $V_{R14}'+\Delta V$, the read inhibition voltage is applied to the memory cell whose threshold voltage is lower than the read voltage $V_{R14}'$ and is on the selected word line based on the inhibition information corresponding to $V_{R14}'+\Delta V$ stored in the master latch DS. After the read operation is performed with $V_{R14}'+\Delta V$, the soft calculation value is stored in the data latch D1, where the soft calculation value is the result obtained by ANDing the above data Data2' and the soft read value corresponding to $V_{R14}'$. For example, when the soft read value corresponding to $V_{R14}'$ is F, then the soft calculation value is G=Data2' & F. At this time, the inhibition information corresponding to $V_{R14}'+\Delta V$ is still stored in the master latch DS.

Then, the master latch DS is released, and the hard data is XORed with the soft calculation value to obtain the soft data. For example, if the soft calculation value is G, then the soft data is SD=HD XOR G, and the soft data is stored in the main latch DS.

In some examples, after storing the soft data in the master latch DS, the hard data is dumped from the bias latch DL into the data latch D3, and the soft data is dumped from the master latch DS into the data latch DC; and the bias latch DL, the data latch D1, and master latch DS are released for use in reading the data of the next page. Here, prior to a read operation on data of the next logical page, the hard data may be dumped from the bias latch DL into the data latch D3, the soft data may be dumped from the master latch DS into the data latch DC, and the bias latch DL, the data latch D1 and the master latch DS can be released.

As mentioned above, compared with the related art in which three read operations need to be performed respectively to obtain the hard data corresponding to QLC, and six read operations need to be performed respectively to obtain the soft data of the lower page of QLC, only six read operations need to be performed to obtain both the hard data and soft data when using the method of controlling the memory according to the examples of the present disclosure to read the hard data and soft data of the lower page of QLC. Since the number of read operations is reduced, the setting time of the word line and the bit line required for the read operation can be reduced, thereby reducing the reading time. Furthermore, when reading the hard data and soft data of the lower page of QLC, the present disclosure only needs to occupy three latches (such as the master latch DS, the bias latch DL and the data latch D1 shown in FIG. 13) without occupying more latches, which allows reservation of more latches for reading the data of the next logical page.

Figure 14:
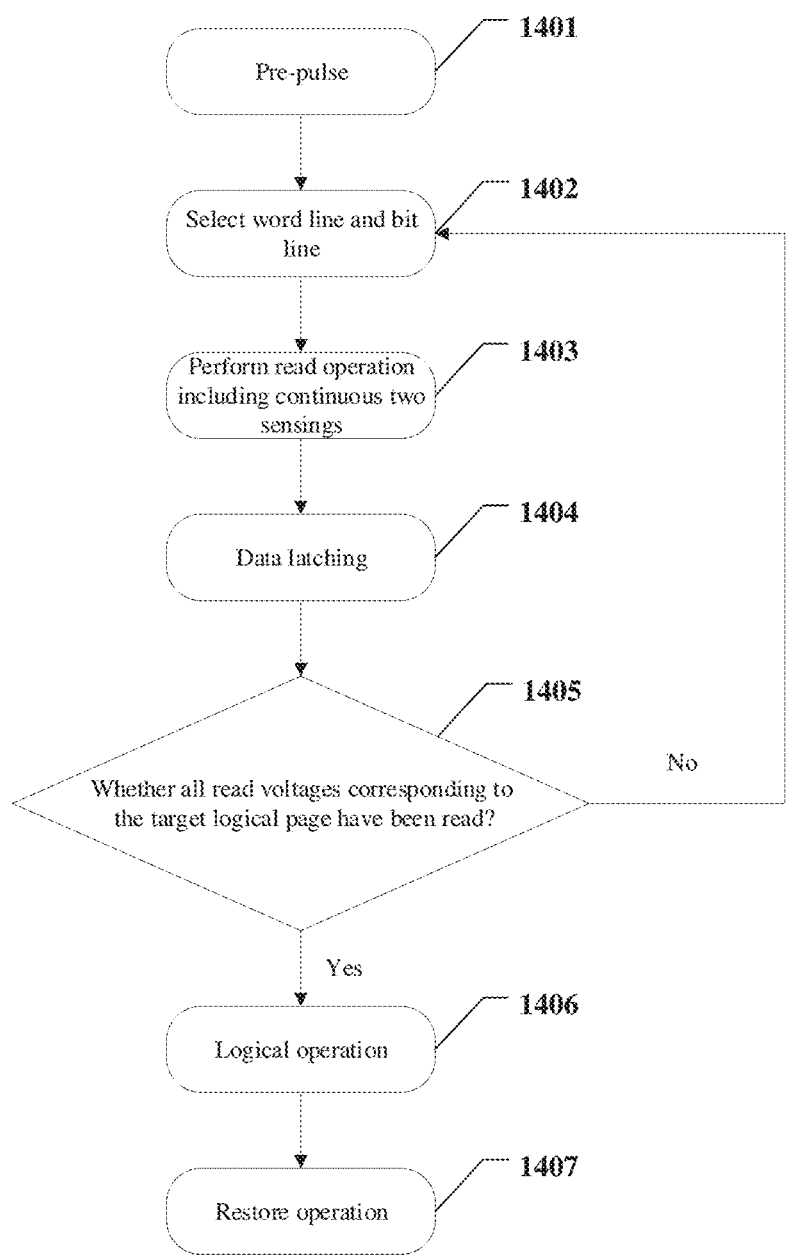
FIG. 14 is a schematic flowchart of another method of controlling a memory, according to an example of the present disclosure.

FIG. 14 is a schematic flowchart of another method of controlling a memory according to an example of the present disclosure. It should be understood that operations 1401-1402 in FIG. 14 are similar to operations 1101-1102 in FIG. 11 described above, and reference may be made to the corresponding descriptions of operations 1101-1102 described above, which will not be repeated herein. At operation 1403, a read operation including two consecutive sensings is performed. In some examples, two consecutive sensing operations as shown in FIG. 10 are performed to obtain a hard read value and a soft read value corresponding to the read voltage.

At operation 1404, data latching is performed. The hard read value, the soft read value, and the inhibition information are stored in the bias latch DL, the first data latch of the N data latches, and the master latch DS, respectively.

At operation 1405, it is determined whether all read voltages corresponding to the target logical page have been read. For example, taking reading the data of the lower page of TLC as an example, if a read operation has been performed with the first read voltage and the fifth read voltage, operation 1406 is executed. If there is a read voltage with which the read operation is not performed in the first read voltage and the fifth read voltage, operations 1402-1404 are performed based on the read voltage with which the read operation is not performed, so as to obtain its corresponding hard read value and soft read value. Operations 1406-1407 are similar to the aforementioned operations 1106-1107 in FIG. 11, and reference may be made to the corresponding descriptions of the aforementioned operations 1106-1107, and details are not repeated herein.

Figures 15A, 15B:
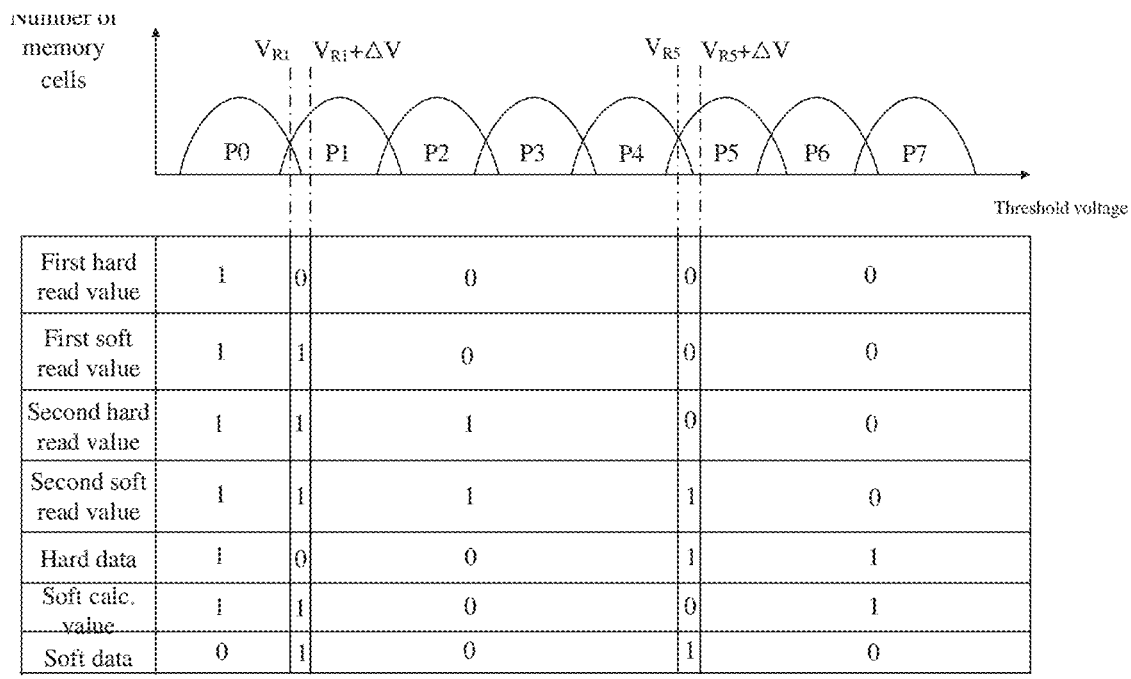
FIG. 15a is a schematic diagram of another process of reading data of lower page of TLC, according to an example of the present disclosure.
FIG. 15b is a schematic diagram of use status of the latches in the page buffer during another storage process of reading data of lower page of TLC, according to an example of the present disclosure.

FIG. 15a is a schematic diagram of another process of reading data of lower page of TLC, according to an example of the present disclosure. As shown in FIG. 15a, a first read voltage is applied to the selected word line firstly, and the first hard read value and the first soft read value are respectively obtained through a first sensing and a second sensing that are continuous, where a first sensing time of the first sensing is less than a second sensing time of the second sensing. The method of obtaining the first hard read value and the first soft read value respectively through the first sensing and the second sensing that are continuous is described above in FIG. 10, and will not be repeated herein. The first read voltage may be the read voltage $V_{R1}$ or $V_{R1}+\Delta V$ shown in FIG. 15a, and the value of $\Delta V$ may be determined based on the threshold voltage distribution of each memory state in the TLC. As shown in FIG. 15a, when the threshold voltage of the memory cell is lower than the read voltage $V_{R1}$, the first hard read value is 1, and when the threshold voltage of the memory cell is greater than the read voltage $V_{R1}$, the first hard read value of the memory cell is 0. When the threshold voltage of the memory cell is lower than the read voltage $V_{R1}+\Delta V$, the first soft read value is 1, and when the threshold voltage of the memory cell is greater than the read voltage $V_{R1}+\Delta V$, the first soft read value is 0. In some other examples, when the threshold voltage of the memory cell is lower than the read voltage $V_{R1}$, the first hard read value is 0, and when the threshold voltage of the memory cell is greater than the read voltage $V_{R1}$, the first hard read value is 1. When the threshold voltage of the memory cell is lower than the read voltage $V_{R1}+\Delta V$, the first soft read value is 0, and when the threshold voltage of the memory cell is greater than the read voltage $V_{R1}+\Delta V$, the first soft read value is 1. However, the present disclosure is not limited by these examples.

Then, a fifth read voltage is applied to the selected word line, and a second hard read value and a second soft read value are respectively obtained through a third sensing and a fourth sensing that are continuous, where a third sensing time of the third sensing is less than a fourth sensing time of the fourth sensing. When the threshold voltage of the memory cell is lower than the read voltage $V_{R5}$, the second hard read value is 1, and when the threshold voltage of the memory cell is greater than the read voltage $V_{R5}$, the second hard read value is 0. When the threshold voltage of the memory cell is lower than the read voltage $V_{R5}+\Delta$, the second soft read value is 1, and when the threshold voltage of the memory cell is greater than the read voltage $V_{R5}+\Delta$, the second soft read value is 0.

The second hard read value is inversed and then ORed with the first hard read value to obtain a result as the hard data of the lower page. For example, the first hard read value is A, the second hard read value is B, then hard data is HD=A+$\overline{B}$. The second soft read value is inversed and then ORed with the first soft read value to obtain a result as the soft calculation value. For example, the first soft read value is C, the second soft read value the value is D, then the soft calculation value is E=C+$\overline{D}$. Then the soft calculation value is XORed with the hard data of the lower page above to obtain the soft data of the lower page. That is, soft data SD=HD XOR E=HD XOR (C+$\overline{D}$). The first hard read value and the second hard read value constitute the hard read value of the lower page of TLC, and the first soft read value and the second soft read value constitute the soft read value of the lower page of TLC.

FIG. 15b is a schematic diagram of use status of the latches in the page buffer in another storage process of reading data of lower page of TLC, according to an example of the present disclosure. After performing a first read operation, that is, after performing the read operation with the first read voltage, the first hard read value is stored in the bias latch DL, and the first soft read value is stored in first data latch D1. At this time, the first inhibition information obtained based on the first read operation is stored in the master latch DS. When the first read voltage is $V_{R1}$, the first inhibition information is used to indicate that when performing a second read operation, that is, when performing the read operation with the fifth read voltage, a read inhibition voltage is applied to the memory cell whose threshold voltage is lower than the read voltage $V_{R1}$ and is on the selected word line. When the first read voltage is $V_{R1}+\Delta V$, the first inhibition information is used to indicate that when performing the second read operation, the read inhibition voltage is applied to the memory cell whose threshold voltage is lower than the read voltage $V_{R1}+\Delta V$ and is on the selected word line.

When performing second read operation, that is, when performing the read operation with the fifth read voltage, the first inhibition information is still stored in the master latch DS, and the read inhibition voltage is applied to the memory cell whose threshold voltage is lower than the read voltage $V_{R1}$ or $V_{R1}+\Delta V$ and is on the selected word line based on the first inhibition information stored in the master latch DS. After performing the second read operation, the hard data is stored in the bias latch DL, the soft calculation value is stored in the first data latch D1, and the master latch DS is released. The hard data is XORed with the soft calculation value to obtain soft data, and the soft data is stored in the master latch DS.

In some examples, after storing the soft data in the master latch DS, the hard data is dumped from the bias latch DL into the second data latch D2, the soft data is dumped from the master latch DS into the third data latch DC, and the bias latch DL, the first data latch D1 and the master latch DS are released for use in reading data of the next logical page. Here, prior to a read operation on data of the next logical page, the hard data can be dumped from the bias latch DL into the second data latch D2 and the soft data can be dumped from the master latch DS into the third data latch DC, and the bias latch DL, the first data latch D1 and the master latch DS can be released.

When the method of controlling the memory may be used to read data of the lower page of TLC, hard data and soft data can be obtained at the same time only by performing two read operations, which can further reduce the number of read operations. This may reduce the setting time of the word line and the bit line required for the read operation. Although the present disclosure adds one sensing compared with the existing techniques, the time required for one sensing is negligible compared to the setting time of the word line and the bit line. Therefore, the present disclosure can reduce the reading time. Moreover, when reading the hard data and soft data of the lower page of TLC according to the present disclosure, it only needs to occupy three latches (such as the master latch DS, bias latch DL and the first data latch D1 FIG. 15b), thus more latches can be reserved for reading data of the next logical page.

Figures 16A, 16B:
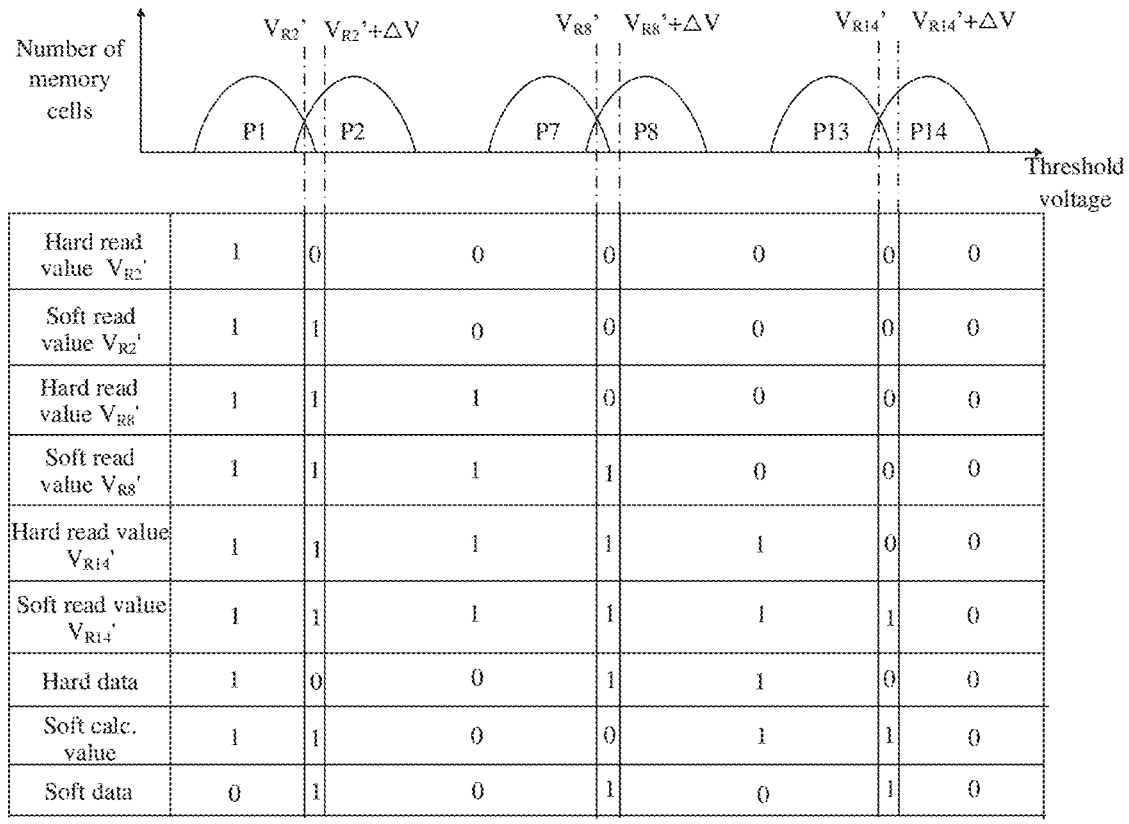
FIG. 16a is a schematic diagram of another process for reading data of lower page of QLC, according to an example of the present disclosure.
FIG. 16b is a schematic diagram of use status of the latches in the page buffer during another storage process of reading data of lower page of QLC, according to an example of the present disclosure.

FIG. 16a is a schematic diagram of another process of reading data of the lower page of QLC, according to an example of the present disclosure. In QLC, each memory cell is configured to store 4-bit data in any one of 16 memory states (e.g., P0-P15 states). Sequentially increasing read voltages $V_{R1}'$-$V_{R15}'$ are used to distinguish 16 memory states. The lower page corresponds to read voltages $V_{R2}'$, $V_{R8}'$ and $V_{R14}'$. The read voltage $V_{R2}'$ is used to distinguish memory states P0-P1 and P2-P15, the read voltage $V_{R8}'$ is used to distinguish memory states P0-P7 and P8-P15, and the read voltage $V_{R14}'$ is used to distinguish memory states P0-P13 and P14-P15. It should be noted that only the threshold voltage distributions corresponding to memory states P1, P2, P7, P8, P13 and P14 are shown in FIG. 16a. As shown in FIG. 16a, the read voltage $V_{R2}'$ is applied to the selected word line first, and a hard read value and a soft read value corresponding to $V_{R2}'$ are respectively obtained through a fifth sensing and a sixth sensing that are continuous, where a fifth sensing time of the fifth sensing is less than a sixth sensing time of the sixth sensing. In some other examples, a read voltage $V_{R2}'+\Delta V$ is applied to the selected word line, and the hard read value and the soft read value corresponding to $V_{R2}'$ are respectively obtained through the fifth sensing and the sixth sensing that are continuous, where the value of $\Delta V$ can be determined based on the threshold voltage distribution of each memory state in the QLC. The hard read value and the soft read value corresponding to $V_{R2}'$ are respectively obtained through the fifth sensing and the sixth sensing that are continuous, which is similar to the way in which the first hard read value and the first soft read value are respectively obtained through the first sensing and the second sensing that are continuous, and will not be repeated herein.

As shown in FIG. 16a, when the threshold voltage of the memory cell is lower than the read voltage $V_{R2}'$, the hard read value corresponding to $V_{R2}'$ is 1, and when the threshold voltage of the memory cell is greater than the read voltage $V_{R2}'$, the hard read value corresponding to $V_{R2}'$ is 0. When the threshold voltage of the memory cell is lower than the read voltage $V_{R2}'+\Delta V$, the soft read value corresponding to $V_{R2}'$ is 1, and when the threshold voltage of the memory cell is greater than the read voltage $V_{R2}'+\Delta V$, the soft read value corresponding to $V_{R2}'$ is 0. In other examples, when the threshold voltage of the memory cell is lower than the read voltage $V_{R2}'$, the hard read value corresponding to $V_{R2}'$ is 0, and when the threshold voltage of the memory cell is greater than the read voltage $V_{R2}'$, the hard read value corresponding to $V_{R2}'$ is 1. When the threshold voltage of the memory cell is lower than the read voltage $V_{R2}'+\Delta V$, the soft read value corresponding to $V_{R2}'$ is 0, and when the threshold voltage of the memory cell is greater than the read voltage $V_{R2}'+\Delta V$, the soft read value corresponding to $V_{R2}'$ is 1.

Then, a read voltage $V_{R8}'$ is applied to the selected word line, and a hard read value and a soft read value corresponding to $V_{R8}'$ are respectively obtained through a seventh sensing and a eighth sensing that are continuous, where a seventh sensing time of the seventh sensing is less than an eighth sensing time of the eighth sensing. When the threshold voltage of the memory cell is lower than the read voltage $V_{R8}'$, the hard read value corresponding to $V_{R8}'$ is 1, and when the threshold voltage of the memory cell is greater than the read voltage $V_{R8}'$, the hard read value corresponding to $V_{R8}'$ is 0. When the threshold voltage of the memory cell is lower than the read voltage $V_{R8}'+\Delta V$, the soft read value corresponding to $V_{R8}'$ is 1, and when the threshold voltage of the memory cell is greater than the read voltage $V_{R8}'+\Delta V$, the soft read value corresponding to $V_{R8}'$ is 0.

Next, a read voltage $V_{R14}'$ is applied to the selected word line, and a hard read value and a soft read value corresponding to $V_{R14}'$ are respectively obtained through a ninth sensing and a tenth sensing that are continuous, where a ninth sensing time of the ninth sensing is less than a tenth sensing time of the tenth sensing. When the threshold voltage of the memory cell is lower than the read voltage $V_{R14}'$, the hard read value corresponding to $V_{R14}'$ is 1, and when the threshold voltage of the memory cell is greater than the read voltage $V_{R14}'$, the hard read value corresponding to $V_{R14}'$ is 0. When the threshold voltage of the memory cell is lower than the read voltage $V_{R14}'+\Delta V$, the soft read value corresponding to $V_{R14}'$ is 1, and when the threshold voltage of the memory cell is greater than the read voltage $V_{R14}'+\Delta V$, the soft read value corresponding to $V_{R14}'$ is 0. The above hard read value corresponding to $V_{R2}'$, the hard read value corresponding to $V_{R8}'$ and the hard read value corresponding to $V_{R14}'$ constitute the hard read value of the lower page of QLC, and the above soft read value corresponding to $V_{R2}'$, the soft read value corresponding to $V_{R8}'$ and the soft read value corresponding to $V_{R14}'$ constitute the soft read value of the lower page of QLC.

The hard read value corresponding to $V_{R8}'$ is inversed and ORed with the hard read value corresponding to $V_{R2}'$ to obtain a result, and then the result is ANDed with the hard read value corresponding to $V_{R14}'$ to obtain the hard data. For example, the hard read value corresponding to $V_{R2}'$ is A, the hard read value corresponding to $V_{R8}'$ is B, the hard read value corresponding to $V_{R14}'$ is C, then the hard data is HD=(A+$\overline{B}$) & C.

The soft read value corresponding to $V_{R8}'$ is inversed and ORed with the soft read value corresponding to $V_{R2}'$ to obtain a result; and then the result is ANDed with the soft read value corresponding to $V_{R14}'$ to obtain a soft calculation value. For example, the soft read value corresponding to $V_{R2}'$ is D, the soft read value corresponding to $V_{R8}'$ is E, the soft read value corresponding to $V_{R14}'$ is F, then the soft calculation value is G=(D+$\overline{E}$) & F.

The above hard data is XORed with the soft calculation value to obtain a result used as the soft data of the lower page of QLC. That is, the soft data is SD=hard data HD XOR soft calculation value G.

FIG. 16b is a schematic diagram of use status of the latches in the page buffer in another storage process of reading data of lower page of QLC, according to an example of the present disclosure. As shown in FIG. 16b, the page buffer of QLC includes a master latch DS, a bias latch DL and four data latches (D1, D2, D3 and DC in FIG. 16b).

After the read operation is performed with $V_{R2}'$, the hard read value corresponding to $V_{R2}'$ is stored in the bias latch DL, and the soft read value corresponding to $V_{R2}'$ is stored in the first data latch D1. At this time, the inhibition information corresponding to $V_{R8}'$ obtained after performing the read operation with $V_{R2}'$ is stored in the master latch DS. The inhibition information corresponding to $V_{R8}'$ is used to indicate that when a read operation is performed with $V_{R8}'$, the read inhibition voltage is applied to the memory cell whose threshold voltage is lower than the read voltage $V_{R2}'$ and is on the selected word line.

When performing a read operation with $V_{R8}'$, a read inhibition voltage is applied to the memory cell whose threshold voltage is lower than the read voltage $V_{R2}'$ and is on the selected word line based on the inhibition information corresponding to $V_{R8}'$ stored in the master latch DS. After the read operation is performed with $V_{R8}'$, data Data1' is stored in the bias latch DL, and data Data2' is stored in the data latch D1. The data Data1' is the result obtained by inversing the hard read value corresponding to $V_{R8}'$ and ORing it with the hard read value corresponding to $V_{R2}'$. For example, the hard read value corresponding to $V_{R2}'$ is A, the hard read value corresponding to $V_{R8}'$ is B, then Data1'=A+$\overline{B}$. The data Data2' is the result obtained by inversing the soft read value corresponding to $V_{R8}'$ and ORing it with the soft read value corresponding to $V_{R2}'$. For example, the soft read value corresponding to $V_{R2}'$ is D, the soft read value corresponding to $V_{R8}'$ is F, then Data2'=D+$\overline{F}$. Meanwhile, the inhibition information corresponding to $V_{R14}'$ obtained after the read operation is performed with $V_{R8}'$ is stored in the master latch DS. The inhibition information corresponding to $V_{R14}'$ is used to indicate that when a read operation is performed with $V_{R14}'$, the read inhibition voltage is applied to the memory cell whose threshold voltage is lower than the read voltage $V_{R8}'$ and is on the selected word line.

When performing a read operation with $V_{R14}'$, the read inhibition voltage is applied to the memory cell whose threshold voltage is lower than the read voltage $V_{R8}'$ and is on the selected word line based on the inhibition information corresponding to $V_{R14}'$ stored in the master latch DS. After the read operation is performed with $V_{R14}'$, the hard data is stored in the bias latch DL, and the soft calculation value is stored in the data latch D1. The hard data is the result obtained by ANDing the above data Data1' and the hard read value corresponding to $V_{R14}'$. For example, the hard read value corresponding to $V_{R14}'$ is C, then the hard data is HD=Data1' & C. The soft calculation value is the result obtained by ANDing the above data Data2' and the soft read value corresponding to $V_{R14}'$. For example, the soft read value corresponding to $V_{R14}'$ is F, then the soft calculation value is G=Data2' & F. At this time, the inhibition information corresponding to $V_{R14}'$ is still stored in the master latch DS.

Then, the master latch DS is released, the hard data is XORed with the soft calculation value to obtain the soft data. For example, the soft calculation value is G, then the soft data is SD=HD XOR G, and the soft data is stored in the main latch DS.

In some examples, after storing the soft data in the master latch DS, the hard data is dumped from the bias latch DL into the data latch D3, and the soft data is dumped from the master latch DS into the data latch DC, and the bias latch DL, the data latch D1, and the master latch DS are released for use in reading data of the next page. Here, prior to a read operation on data of the next logical page, the hard data can be dumped from the bias latch DL into the data latch D3 and the soft data can be dumped from the master latch DS into the data latch DC, and the bias latch DL, the data latch D1, and the master latch DS can be released.

As mentioned above, when reading data of the lower page of QLC by using the method of controlling the memory according to the example of the present disclosure, hard data and soft data can be obtained at the same time only by performing three read operations, which can further reduce the number of read operations, thus reducing the setting time of the word line and the bit line required for the read operation and reducing the reading time. Moreover, when reading the hard data and soft data of the lower page of QLC according to the present disclosure, it only needs to occupy three latches (such as the master latch DS, bias latch DL and the data latch D1 FIG. 16) without occupying more latches, thus more latches can be reserved for reading data of the next logical page.

The example of the present disclosure also provides a memory. As shown in FIG. 3, the memory 300 includes a memory cell array 301 and a peripheral circuit 302. The memory cell array 301 includes a plurality of memory cells, and each memory cell is configured to store N-bit data, where N is an integer greater than 1. The peripheral circuit 302 is coupled to the memory cell array 301, and the peripheral circuit includes a page buffer.

The peripheral circuit 302 is configured to perform a read operation based on a read voltage corresponding to a target logical page to obtain a hard read value and a soft read value of the target logical page. The peripheral circuit 302 is configured to store the hard read value, the soft read value and inhibition information into three latches in the page buffer respectively. The peripheral circuit 302 is configured to obtain hard data of the target logical page based on the hard read value of the target logical page. The peripheral circuit 302 is configured to obtain soft data of the target logical page based on the hard data and the soft read value of the target logical page.

In some examples, the page buffer may include a master latch, a bias latch, and N data latches. In some implementations, the peripheral circuit is configured to store the hard read value, the soft read value, and the inhibition information into the bias latch, a first data latch of the N data latches and the master latch respectively. In some implementations, the peripheral circuit is configured to store the hard read value, the soft read value, and the inhibition information into the first data latch of the N data latches, the bias latch, and the master latch respectively.

In some examples, the peripheral circuit is further configured to, after obtaining the hard data, release the master latch. The peripheral circuit is configured to, after obtaining the soft data, store the soft data into the master latch.

In some examples, the peripheral circuit is further configured to dump the hard data from the bias latch or the first data latch into a second data latch of the N data latches. The peripheral circuit is configured to dump the soft data from the master latch into a third data latch of the N data latches. The peripheral circuit is configured to release the bias latch, the first data latch, and the master latch.

In some examples, each of the target logical pages corresponds to at least one of the read voltages; and the peripheral circuit is configured to, after applying each of the read voltages to the memory cell, obtain the hard read value and the soft read value corresponding to the read voltage respectively by a first sensing and a second sensing that are continuous, where the first sensing time of the first sensing is less than the second sensing time of the second sensing.

In some examples, when N is 3, each of the memory cells is configured to store 3-bit data in one of $2^3$ memory states; and a first read voltage to a seventh read voltage are used to distinguish the $2^3$ memory states.

In some examples, when N is 3, a first logical page of three logical pages corresponds to the first read voltage and a fifth read voltage; a second logical page of the three logical pages corresponds to a second read voltage, a fourth read voltage and a sixth read voltage; and a third logical page of the three logical pages corresponds to a third read voltage and the seventh read voltage. The first read voltage to the seventh read voltage may increase sequentially.

In some examples, when the target logical page is the first logical page, the peripheral circuit is configured to, apply the first read voltage to the memory cell. In some examples, when the target logical page is the first logical page, the peripheral circuit is configured to, obtain a first hard read value and a first soft read value respectively by a first sensing and a second sensing that are continuous, where the first sensing time of the first sensing is less than the second sensing time of the second sensing. In some examples, when the target logical page is the first logical page, the peripheral circuit is configured to, apply the fifth read voltage to the memory cell; obtain a second hard read value and a second soft read value respectively by a third sensing and a fourth sensing that are continuous, where the third sensing time of the third sensing is less than the fourth sensing time of the fourth sensing. The first hard read value and the second hard read value may constitute the hard read value of the first logical page, and the first soft read value and the second soft read value may constitute the soft read value of the first logical page.

In some examples, the peripheral circuit is configured to apply a hard read voltage and a soft read voltage to the memory cell respectively to obtain the hard read value and the soft read value of the target logical page respectively.

It should be understood that reference throughout the specification to "one example" or "an example" means that a particular feature, structure or characteristic related to the example is included in at least one example of the present disclosure. Thus, appearances of "in one example" or "in an example" in various places throughout the specification are not necessarily referring to the same example. Furthermore, these particular features, structures or characteristics may be combined in any suitable manner in one or more examples. It should be understood that in various examples of the present disclosure, the sequence numbers of the above-mentioned processes do not mean the order of execution, and the execution order of the processes should be determined by their functions and inherent logic, rather than limiting example process of the examples of the present disclosure. The sequence numbers of the above-mentioned examples of the present disclosure are for description only, and do not represent the advantages and disadvantages of the examples.

The methods disclosed in the several method examples provided in the present disclosure can be combined arbitrarily to obtain new method examples if there is no conflict.

The forgoing description is only a specific example of the present disclosure, but the protection scope of the present disclosure is not limited thereto. Anyone skilled in the art can easily conceive of changes or substitutions within the technical scope of the present disclosure, which should fall within the protection scope of the present disclosure. Therefore, the protection scope of the present disclosure should be determined by the protection scope of the claims.

What is claimed is:

1. A method of controlling a memory, comprising:
performing a read operation based on a read voltage corresponding to a target logical page to obtain a hard read value and a soft read value of the target logical page;
storing the hard read value, the soft read value, and inhibition information into three latches in a page buffer respectively;
obtaining hard data of the target logical page based on the hard read value of the target logical page; and
obtaining soft data of the target logical page based on the hard data and the soft read value of the target logical page,
wherein the memory comprises a plurality of memory cells,
wherein each of the memory cells is configured to store N-bit data, and
wherein N is an integer greater than 1.

2. The method of claim 1, wherein:
the page buffer comprises:
a master latch,
a bias latch, and
N data latches, and
the storing the hard read value, the soft read value, and the inhibition information into the three latches in the page buffer respectively comprises:
storing the hard read value, the soft read value, and the inhibition information into the bias latch, a first data latch of the N data latches, and the master latch respectively; or
storing the hard read value, the soft read value, and the inhibition information into the first data latch of the N data latches, the bias latch, and the master latch respectively.

3. The method of claim 2, further comprising:
after obtaining the hard data, releasing the master latch; and
after obtaining the soft data, storing the soft data into the master latch.

4. The method of claim 3, further comprising:
dumping the hard data from the bias latch or the first data latch into a second data latch of the N data latches;
dumping the soft data from the master latch into a third data latch of the N data latches; and
releasing the bias latch, the first data latch, and the master latch.

5. The method of claim 1, wherein:
each of the target logical pages corresponds to at least one of the read voltages; and
the performing the read operation based on the read voltage corresponding to the target logical page to obtain the hard read value and the soft read value of the target logical page comprises:
after applying each of the read voltages to the memory cell, obtaining the hard read value and the soft read value corresponding to the read voltage respectively by a first sensing and a second sensing that are continuous, sensing time of the first sensing being less than sensing time of the second sensing.

6. The method of claim 1, wherein:
when N is 3, each of the memory cells is configured to store 3-bit data in one of $2^3$ memory states; and
a first read voltage to a seventh read voltage are used to distinguish the $2^3$ memory states.

7. The method of claim 6, wherein:
when N is 3, a first logical page of three logical pages corresponds to the first read voltage and a fifth read voltage,
a second logical page of the three logical pages corresponds to a second read voltage, a fourth read voltage, and a sixth read voltage,
a third logical page of the three logical pages corresponds to a third read voltage and the seventh read voltage, and
the first read voltage to the seventh read voltage increase sequentially.

8. The method of claim 7, wherein when the target logical page is the first logical page, the performing the read operation based on the read voltage corresponding to the target logical page to obtain the hard read value and the soft read value of the target logical page comprises:
applying the first read voltage to the memory cell;
obtaining a first hard read value and a first soft read value respectively by a first sensing and a second sensing that are continuous, wherein sensing time of the first sensing is less than sensing time of the second sensing;
applying the fifth read voltage to the memory cell; and
obtaining a second hard read value and a second soft read value respectively by a third sensing and a fourth sensing that are continuous, wherein sensing time of the third sensing is less than sensing time of the fourth sensing, the first hard read value and the second hard read value constituting the hard read value of the first logical page, and the first soft read value and the second soft read value constituting the soft read value of the first logical page.

9. The method of claim 1, wherein the performing the read operation based on the read voltage corresponding to the target logical page to obtain the hard read value and the soft read value of the target logical page comprises:
applying a hard read voltage and a soft read voltage to the memory cells respectively to obtain the hard read value and the soft read value of the target logical page respectively.

10. A memory, comprising:
a memory cell array comprising a plurality of memory cells, each of the memory cells being configured to store N-bit data, wherein N is an integer greater than 1; and
a peripheral circuit coupled to the memory cell array, the peripheral circuit including a page buffer, and the peripheral circuit being configured to:
perform a read operation based on a read voltage corresponding to a target logical page to obtain a hard read value and a soft read value of the target logical page, and store the hard read value, the soft read value, and inhibition information into three latches in the page buffer respectively;
obtain hard data of the target logical page based on the hard read value of the target logical page; and
obtain soft data of the target logical page based on the hard data and the soft read value of the target logical page.

11. The memory of claim 10, wherein:
the page buffer comprises:
a master latch,
a bias latch, and
N data latches; and
the peripheral circuit is configured to:
store the hard read value, the soft read value, and the inhibition information into the bias latch, a first data latch of the N data latches, and the master latch respectively; or store the hard read value, the soft read value, and the inhibition information into the first data latch of the N data latches, the bias latch, and the master latch respectively.

12. The memory of claim 11, wherein the peripheral circuit is further configured to:
after obtaining the hard data, release the master latch; and
after obtaining the soft data, store the soft data into the master latch.

13. The memory of claim 12, wherein the peripheral circuit is further configured to:
dump the hard data from the bias latch or the first data latch into a second data latch of the N data latches;
dump the soft data from the master latch into a third data latch of the N data latches; and
release the bias latch, the first data latch, and the master latch.

14. The memory of claim 10, wherein:
each of the target logical pages corresponds to at least one of the read voltages; and
the peripheral circuit is configured to:
after applying each of the read voltages to the memory cell, obtain the hard read value and the soft read value corresponding to the read voltage respectively by a first sensing and a second sensing that are continuous, a first sensing time of the first sensing being less than a second sensing time of the second sensing.

15. The memory of claim 10, wherein:
when N is 3, each of the memory cells is configured to store 3-bit data in one of $2^3$ memory states; and
a first read voltage to a seventh read voltage are used to distinguish the $2^3$ memory states.

16. The memory of claim 15, wherein:
when N is 3, a first logical page of three logical pages corresponds to the first read voltage and a fifth read voltage,
a second logical page of the three logical pages corresponds to a second read voltage, a fourth read voltage, and a sixth read voltage,
a third logical page of the three logical pages corresponds to a third read voltage and the seventh read voltage, and
the first read voltage to the seventh read voltage increase sequentially.

17. The memory of claim 16, wherein:
when the target logical page is the first logical page, the peripheral circuit is configured to:
apply the first read voltage to the memory cell;
obtain a first hard read value and a first soft read value respectively by a first sensing and a second sensing that are continuous, a first sensing time of the first sensing is less than a second sensing time of the second sensing;
apply the fifth read voltage to the memory cell;
obtain a second hard read value and a second soft read value respectively by a third sensing and a fourth sensing that are continuous, a third sensing time of the third sensing is less than a third sensing time of the fourth sensing, and
the first hard read value and the second hard read value constitute the hard read value of the first logical page, and the first soft read value and the second soft read value constitute the soft read value of the first logical page.

18. The memory of claim 10, wherein the peripheral circuit is configured to:
apply a hard read voltage and a soft read voltage to the memory cells respectively to obtain the hard read value and the soft read value of the target logical page respectively.

19. A memory system, comprising:
at least one memory, comprising:
a memory cell array comprising a plurality of memory cells, each of the memory cells being configured to store N-bit data, wherein N is an integer greater than 1; and
a peripheral circuit coupled to the memory cell array, the peripheral circuit including a page buffer, and the peripheral circuit being configured to:
perform a read operation based on a read voltage corresponding to a target logical page to obtain a hard read value and a soft read value of the target logical page, and store the hard read value, the soft read value, and inhibition information into three latches in the page buffer respectively;
obtain hard data of the target logical page based on the hard read value of the target logical page; and
obtain soft data of the target logical page based on the hard data and the soft read value of the target logical page; and
a controller coupled to the memory.

20. The memory system of claim 19, wherein:
the page buffer comprises:
a master latch,
a bias latch, and
N data latches; and
the peripheral circuit is configured to:
store the hard read value, the soft read value, and the inhibition information into the bias latch, a first data latch of the N data latches, and the master latch respectively; or
store the hard read value, the soft read value, and the inhibition information into the first data latch of the N data latches, the bias latch, and the master latch respectively.

* * * * *